US008367943B2

(12) United States Patent
Wu et al.

(10) Patent No.: US 8,367,943 B2
(45) Date of Patent: *Feb. 5, 2013

(54) MULTILAYERED PRINTED WIRING BOARD

(75) Inventors: Youhong Wu, Ibi-gun (JP); Masanori Tamaki, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/831,389

(22) Filed: Jul. 31, 2007

(65) Prior Publication Data
US 2008/0314632 A1 Dec. 25, 2008

Related U.S. Application Data

(63) Continuation of application No. PCT/JP2006/301454, filed on Jan. 30, 2006.

(30) Foreign Application Priority Data

Feb. 2, 2005 (JP) .................................. 2005-026897
Feb. 2, 2005 (JP) .................................. 2005-026899

(51) Int. Cl.
H05K 1/16 (2006.01)
(52) U.S. Cl. ........................................ 174/262; 174/260
(58) Field of Classification Search .......... 174/260–266; 361/792–795
See application file for complete search history.

(56) References Cited

U.S. PATENT DOCUMENTS

| 5,956,843 | A  | * | 9/1999  | Mizumoto et al. | .............. | 29/852  |
| 7,183,497 | B2 | * | 2/2007  | Kojima et al.   | ................ | 174/262 |
| 7,230,188 | B1 | * | 6/2007  | En et al.       | ......................... | 174/257 |
| 7,402,760 | B2 | * | 7/2008  | Wu              | ............... | 174/265 |
| 2004/0177999 | A1 | * | 9/2004 | Saiki et al.    | ..................... | 174/263 |
| 2007/0074902 | A1 | * | 4/2007 | Hirata          | ............................. | 174/262 |
| 2008/0289864 | A1 | * | 11/2008 | En et al.      | ........................ | 174/257 |
| 2008/0296052 | A1 | * | 12/2008 | Inagaki et al. | ................ | 174/260 |

FOREIGN PATENT DOCUMENTS

| EP | 1 011 139 A1 | 6/2000 |
| EP | 1 117 283 A1 | 7/2001 |
| EP | 1117283 A1 * | 7/2001 |
| JP | 11-4075 | 1/1999 |
| JP | 11-251749 | 9/1999 |
| JP | 11-354932 | 12/1999 |
| JP | 2000-101246 | 4/2000 |
| JP | 2000-165046 | 6/2000 |

(Continued)

Primary Examiner — Yuriy Semenenko
(74) Attorney, Agent, or Firm — Oblon, Spivak, McClelland, Maier & Neustadt, L.L.P.

(57) ABSTRACT

A multilayered printed wiring board has a core substrate having a through hole opening with a radius R, a through hole structure formed at the through hole opening and including a lid-shaped conductive structure, a first interlaminar resin insulation layer formed over the core substrate and having a first via hole structure with a bottom radius r, and a second interlaminar resin insulation layer formed over the first interlaminar resin insulation layer and having a second via hole structure. The lid-shaped conductive structure is formed over the core substrate at an end portion of the through-hole opening and covering the end portion of the through-hole opening. The first via hole structure is formed on the lid-shaped conductive structure and has an electroless plated film and an electrolytic plated film. The second via hole structure has an electroless plated film and an electrolytic plated film. The first via hole has a gravity center at or beyond a radius D, where $D=(R-r/3)$ and the radius D is measured from a gravity center of the through-hole opening, and the bottom radius r of the first via hole is larger than a bottom radius of the second via hole.

25 Claims, 15 Drawing Sheets

FOREIGN PATENT DOCUMENTS

| | | |
|---|---|---|
| JP | 2001-044640 | 2/2001 |
| JP | 2001-127435 | 5/2001 |
| JP | 2002-9443 | 1/2002 |
| JP | 2002-94239 | 3/2002 |
| JP | 2002-094240 | 3/2002 |
| JP | 2002-100870 | 4/2002 |
| JP | 2002-208778 | 7/2002 |
| JP | 2003-152311 | 5/2003 |
| JP | 2003-188539 | 7/2003 |
| JP | 2003-218531 | 7/2003 |
| JP | 2003218531 | * 7/2003 |
| JP | 2004335506 | * 11/2004 |

* cited by examiner (A)

(B)

(C)

(A)

(B)

(A)

(B)

US 8,367,943 B2

MULTILAYERED PRINTED WIRING BOARD

CROSS-REFERENCE TO RELATED APPLICATIONS

This application is a continuation application and claims priority to an international application, PCT/JP2006/301454, filed Jan. 30, 2006, which claims priority to Japanese Applications, 2005-026897 and 2005-026899, filed Feb. 2, 2005. The contents of those applications are incorporated herein by reference.

BACKGROUND OF INVENTION

1. Field of the Invention

The present invention relates to a multilayered printed wiring board, especially, to a built-up multilayered printed wiring board suitable to be used as a packaging substrate to mount IC chips.

2. Discussion of the Background

Japanese Unexamined Patent Publications 2001-127435 and 2002-208778 are directed to a built-up multilayered printed wiring board (hereinafter referred to as a "multilayered PWB") having through-holes and conductive layers covering through-hole surfaces. Japanese Unexamined Patent Publication H11-251749 is directed to a multilayered PWB having a via hole filled with conductive material. The contents of these publications are incorporated herein by reference in their entirety.

SUMMARY OF THE INVENTION

According to one aspect of the present invention, a multilayered printed wiring board has a core substrate having a through hole opening with a radius R, a through hole structure formed at the through hole opening and including a lid-shaped conductive structure, a first interlaminar resin insulation layer formed over the core substrate and having a first via hole structure with a bottom radius r, and a second interlaminar resin insulation layer formed over the first interlaminar resin insulation layer and having a second via hole structure. The lid-shaped conductive structure is formed over the core substrate at an end portion of the through-hole opening and covering the end portion of the through-hole opening. The first via hole structure is formed on the lid-shaped conductive structure and has an electroless plated film and an electrolytic plated film. The second via hole structure has an electroless plated film and an electrolytic plated film. The first via hole has a gravity center at or beyond a radius D, where D=(R−r/3) and the radius D is measured from a gravity center of the through-hole opening, and the bottom radius r of the first via hole is larger than a bottom radius of the second via hole.

According to another aspect of the present invention, a multilayered printed wiring board has a core substrate, a first interlaminar resin insulation layer formed over the core substrate and having a first filled via structure, and a second interlaminar resin insulation layer formed over the first interlaminar resin insulation layer and having a second filled via structure. The first filled via structure has an electroless plated film and an electrolytic plated film. The second filled via structure has an electroless plated film and an electrolytic plated film and formed directly over the first filled via structure. The first filled via structure has the bottom diameter which is smaller than the bottom diameter of the second filled via structure.

BRIEF DESCRIPTION OF THE DRAWINGS

A more complete appreciation of the invention and many of the attendant advantage thereof will be readily obtained as the same becomes better understood by reference to the following detailed description when considered in connection with the accompanying drawings, wherein.

DESCRIPTION OF THE EMBODIMENTS

Figure 1:
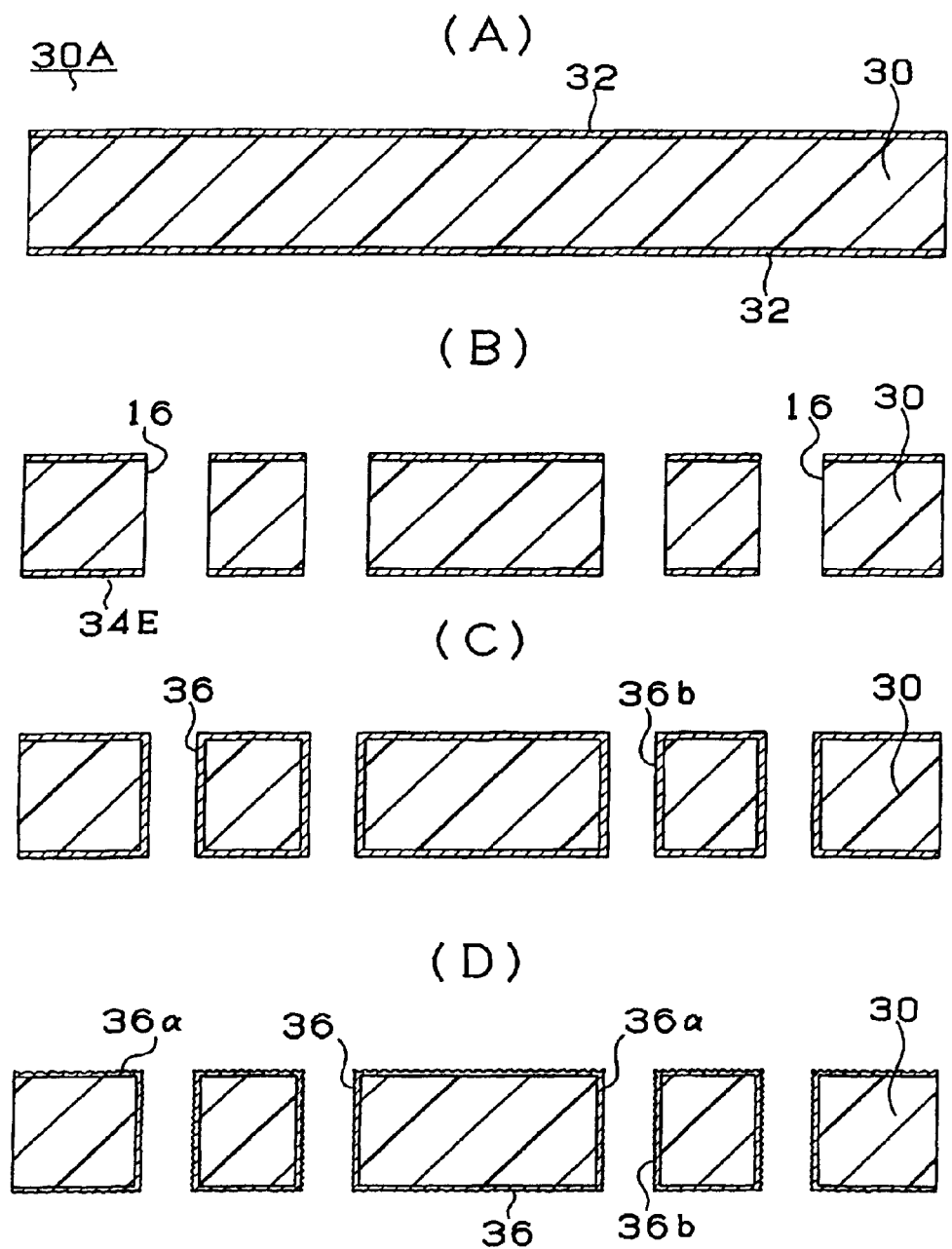
FIGS. 1(A) through 1(D) are views illustrating manufacturing steps of a multilayered PWB according to an embodiment of the present invention.
Figure 2:
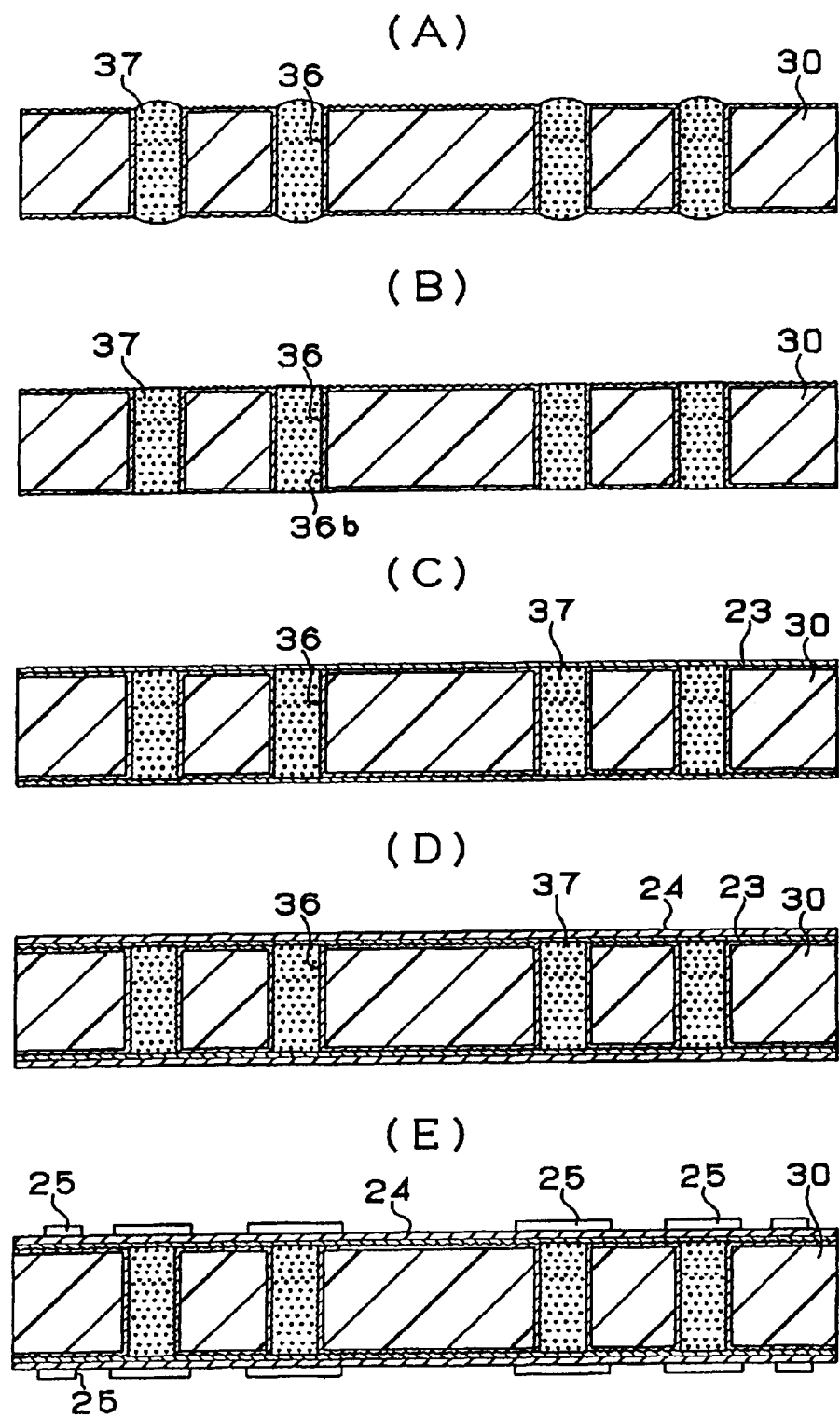
FIGS. 2(A) through 2(E) are views illustrating manufacturing steps of the multilayered PWB following FIG. 1(D)
Figure 3:
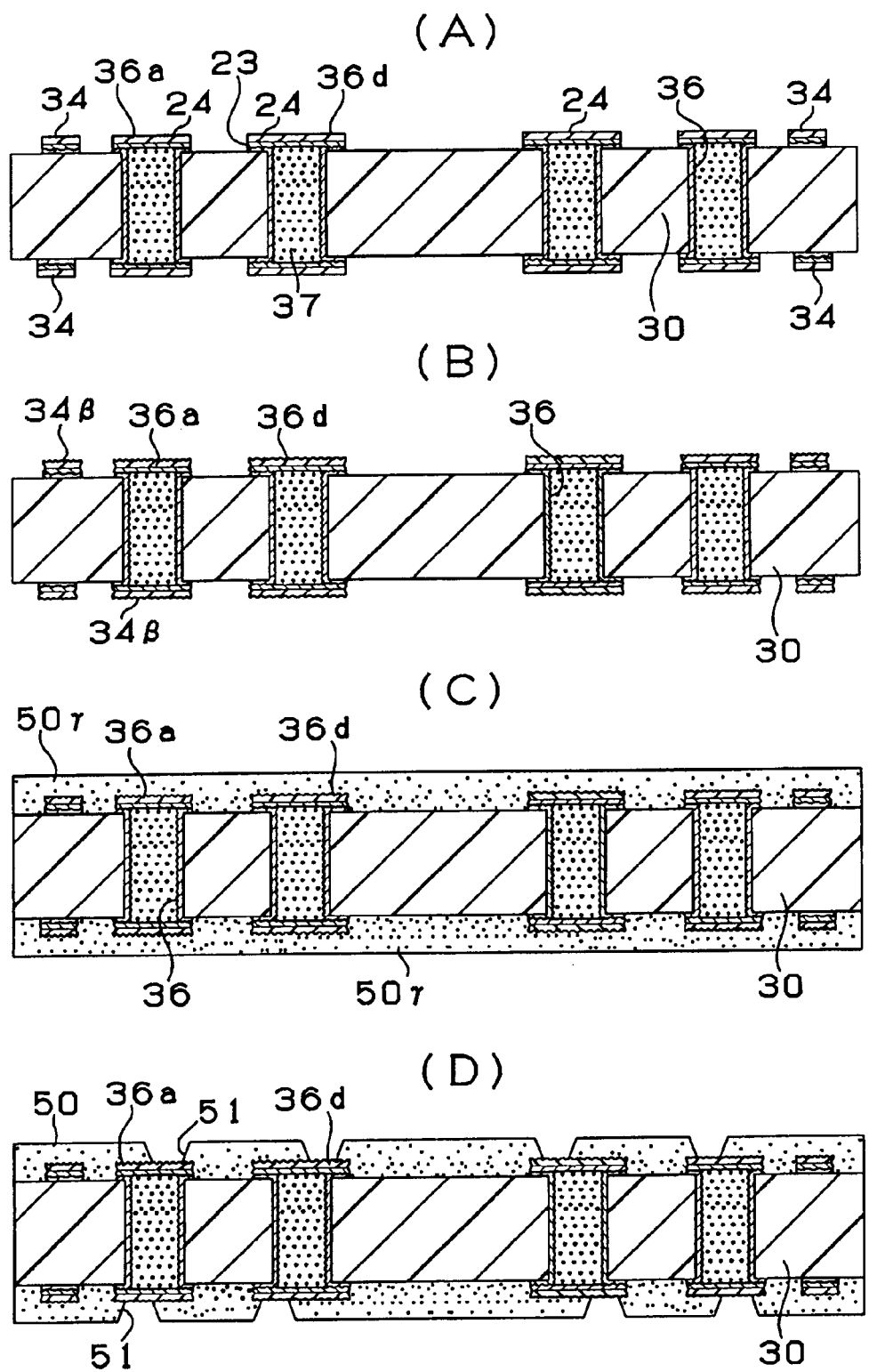
FIGS. 3(A) through 3(D) are views illustrating manufacturing steps of the multilayered PWB following FIG. 2(E)
Figure 4:
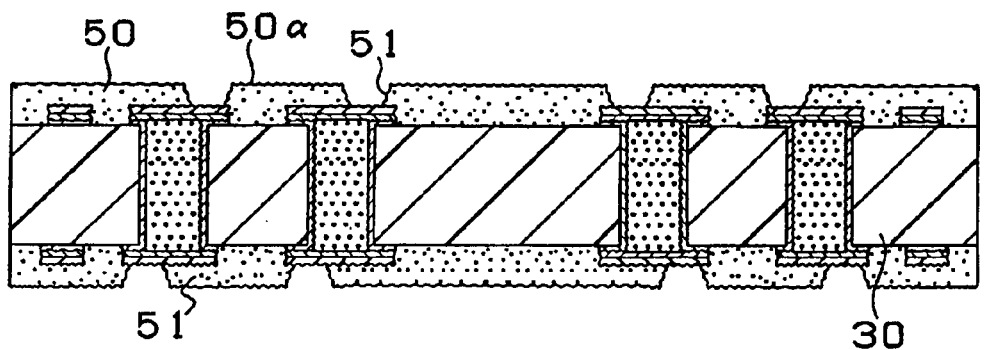
FIGS. 4(A) through 4(C) are views illustrating manufacturing steps of the multilayered PWB following FIG. 3(D)
Figure 4:
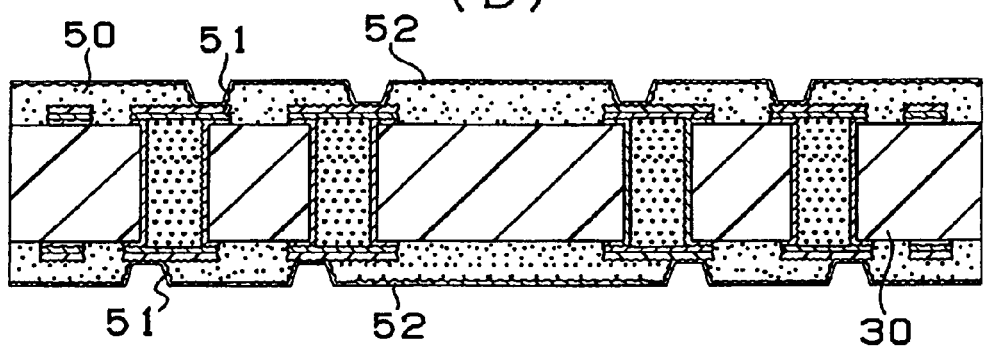
Figure 4:
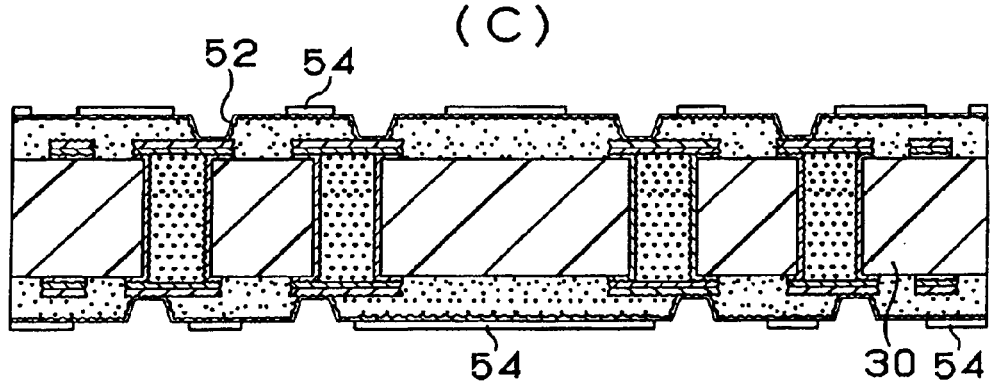
Figure 5:
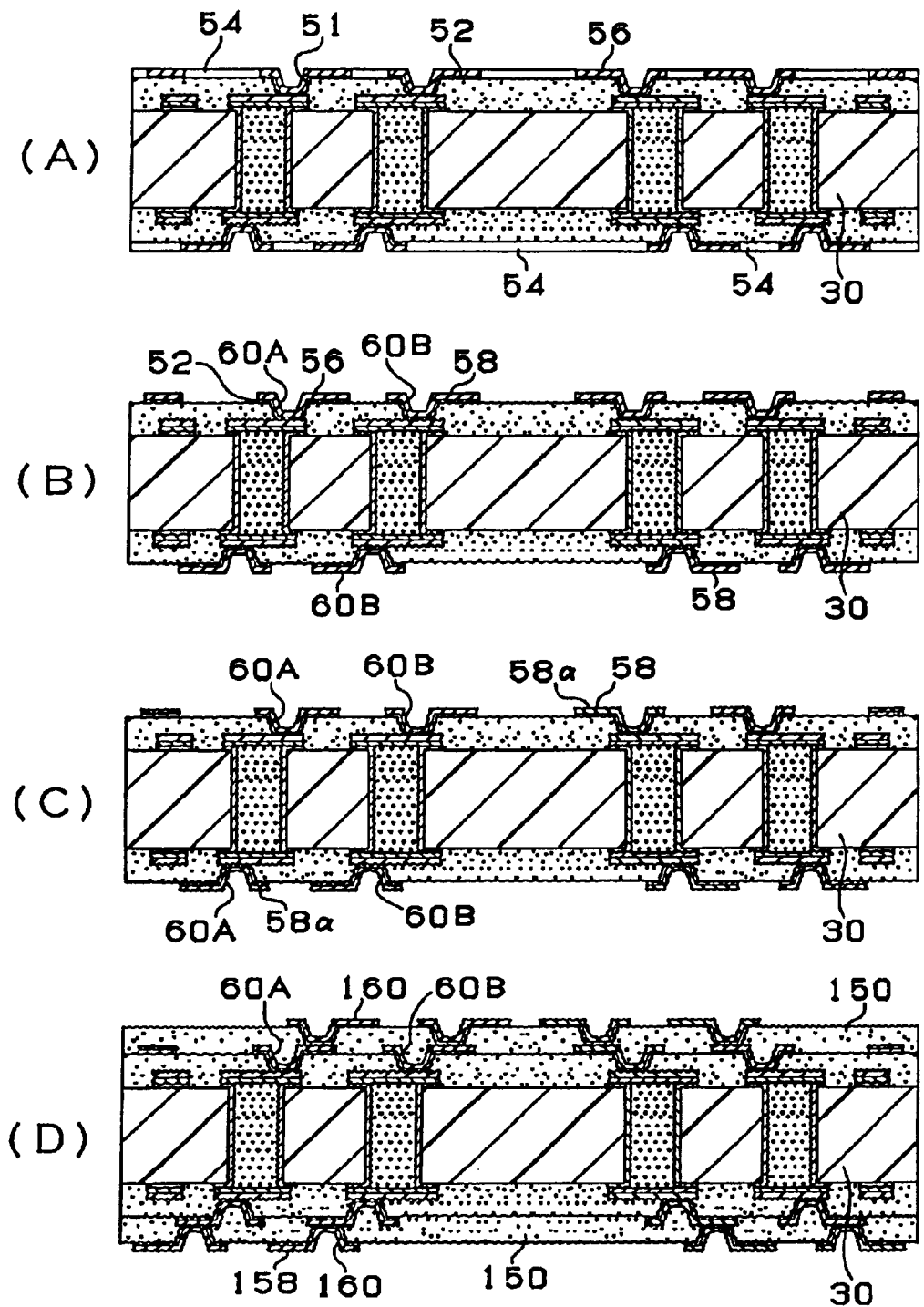
FIGS. 5(A) through 5(D) are views illustrating manufacturing steps of the multilayered PWB following FIG. 4(C)
Figure 6:
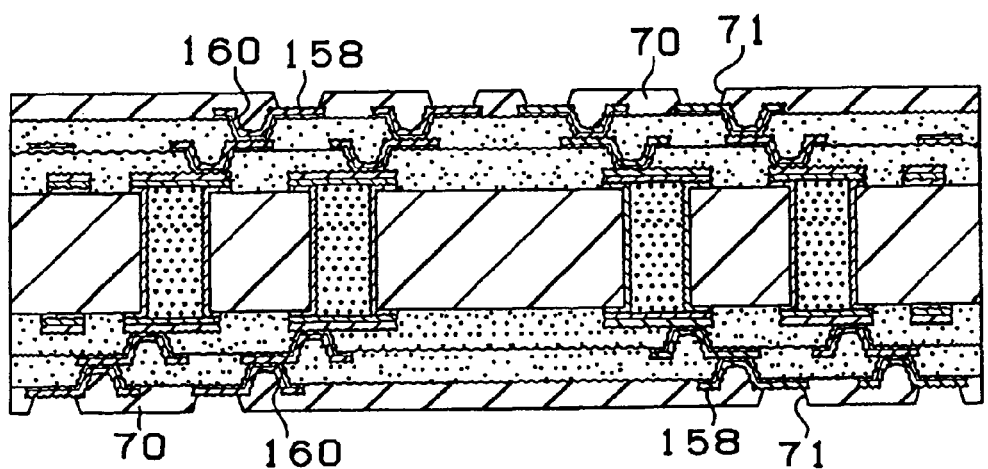
FIGS. 6(A) through 6(B) are views illustrating manufacturing steps of the multilayered PWB following FIG. 5(D)
Figure 6:
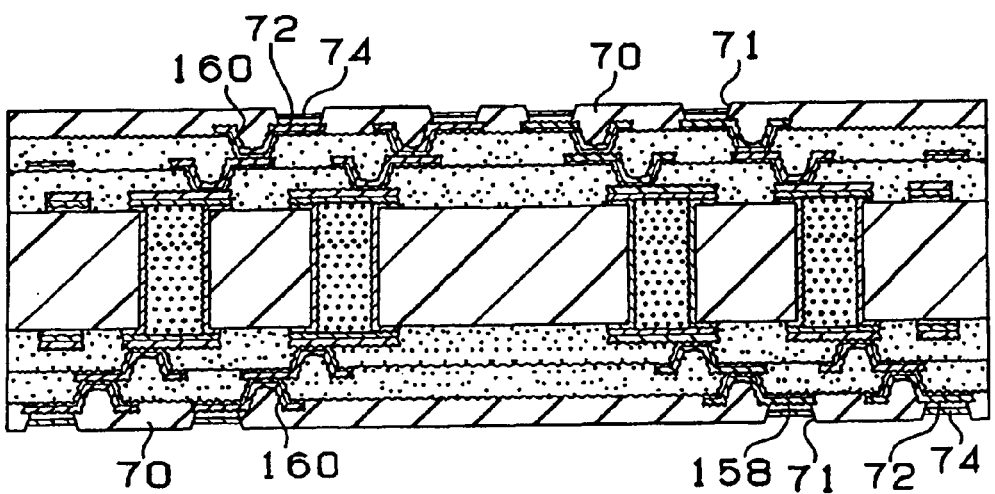

The embodiments will now be described with reference to the accompanying drawings, wherein like reference numerals designate corresponding or identical elements throughout the various drawings.

Figure 7:
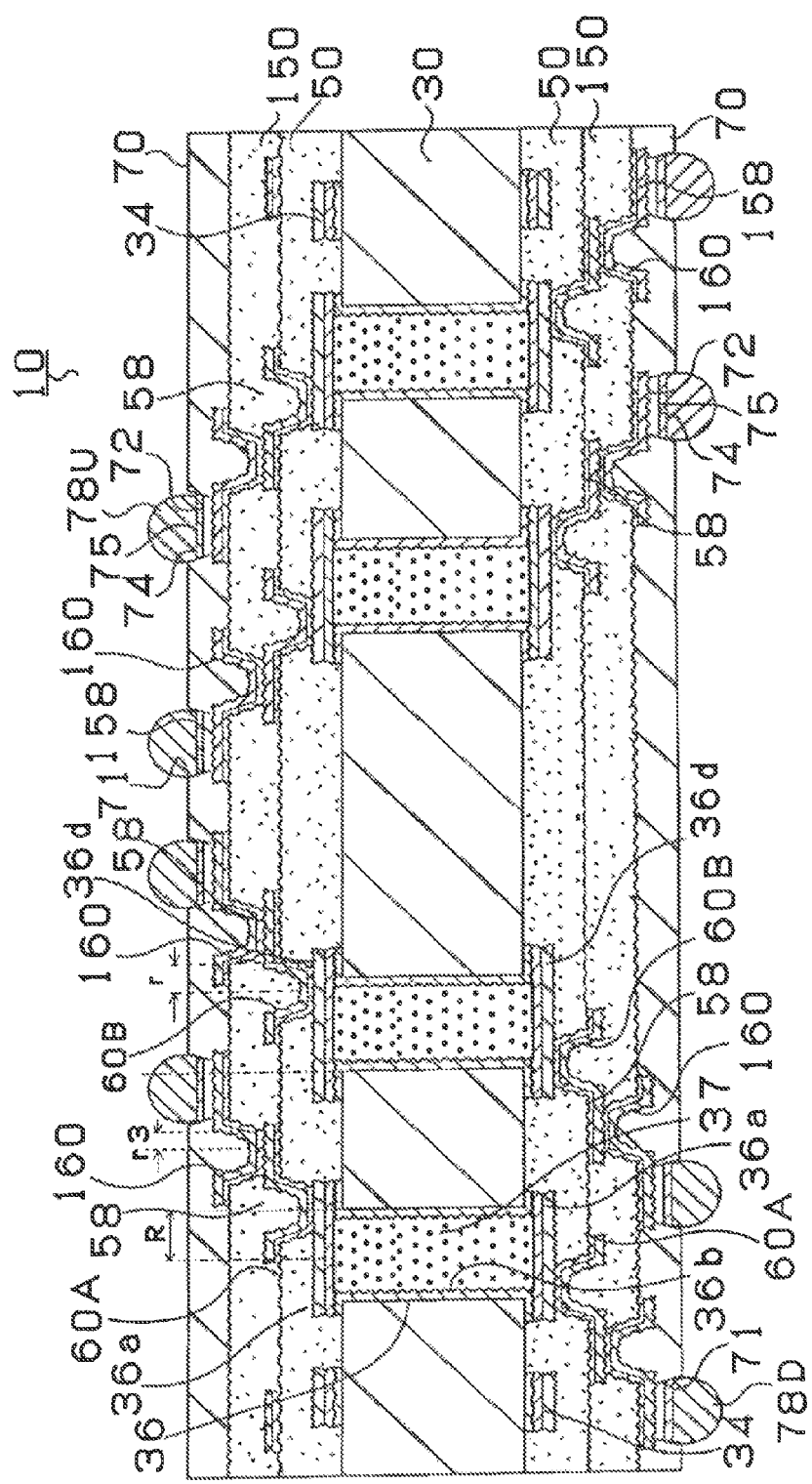
FIG. 7 is a cross-sectional view of the multilayered PWB according to an embodiment of the present invention related to FIGS. 1 through 6.
Figure 8:
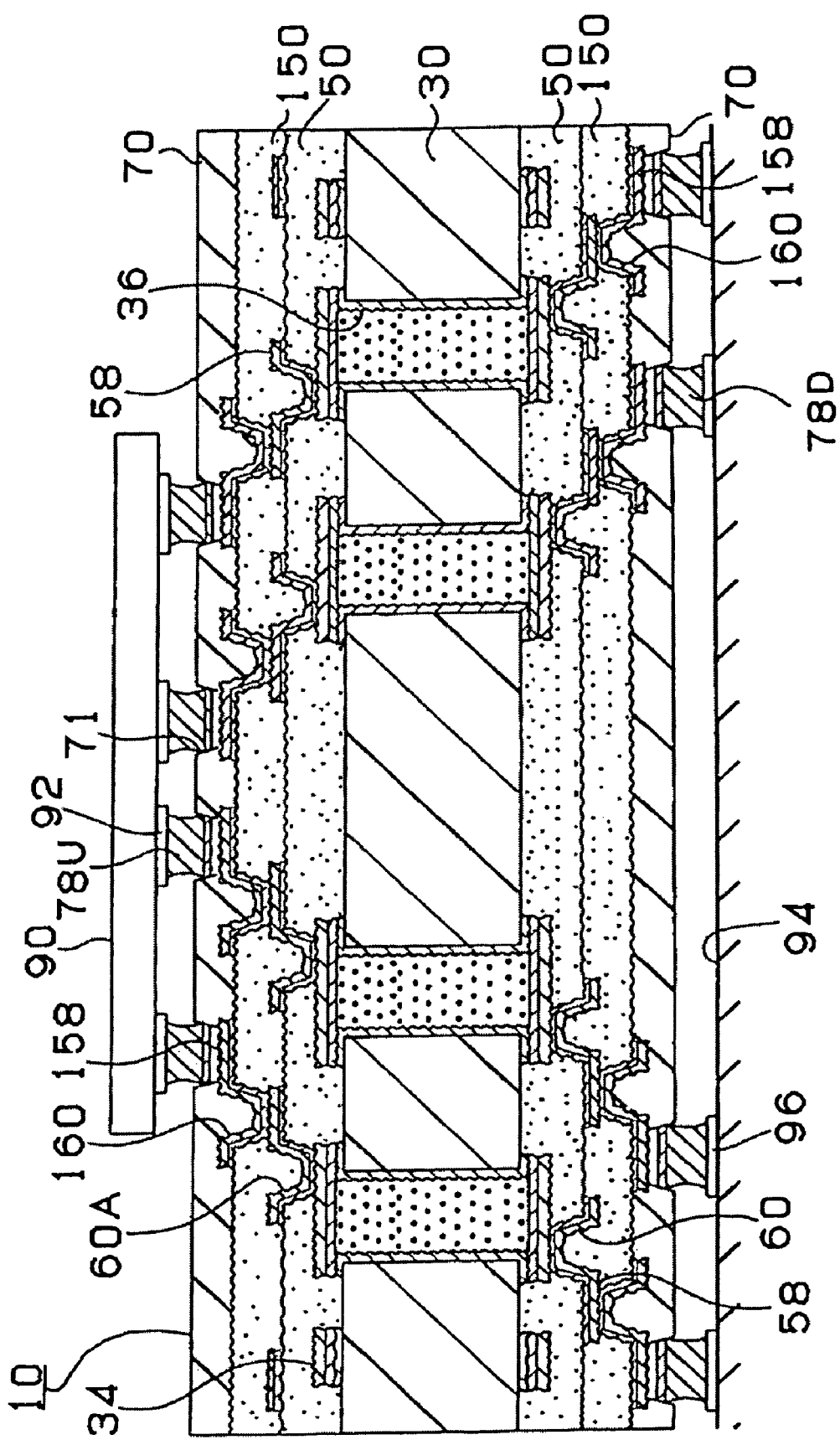
FIG. 8 is a cross-sectional view illustrating the multilayered PWB of FIG. 7 with a mounted IC chip.

First, a multilayered PWB 10 according to an embodiment of the present invention is described with reference to FIGS. 1-8. FIG. 7 is a cross-sectional view of multilayered PWB 10, and FIG. 8 is a view illustrating multilayered PWB 10 shown in FIG. 7 with IC chip 90 mounted on daughter board 94. As shown in FIG. 7, in multilayered PWB 10, conductive circuits 34 are formed on the surfaces of core substrate 30. The upper surface and lower surface of core substrate 30 are connected via through hole structures (hereinafter "through-holes") 36. Through-holes 36 are constructed with plated cover layers (36a, 36d) which make up through-hole lands and side-wall conductive layers (36b). The area enveloped by side-wall conductive layers (36b) is filled with resin filler 37, but may also be filled with a conductive material such as copper and without resin filler. On plated cover layers (through-hole lands which is lid-shaped conductive structures) (36a, 36d), interlaminar resin insulation layers 50 having via hole structures (hereinafter "via holes") (60A, 60B) and conductive circuits 58, as well as interlaminar resin insulation layers 150 having via hole structures (hereinafter as "via holes") 160 and conductive circuits 158, are formed. As an upper layer over via holes 160 and conductive circuits 158, solder-resist layer 70 is formed. Through openings 71 of solder-resist layers 70, bumps (78U, 78D) are formed over via holes 160 and conductive circuits 158.

As shown in FIG. 8, solder bumps (78U) on the upper surface of multilayered PWB 10 are connected to lands 92 of IC chip 90. On the other hand, solder bumps (78D) on the lower surface are connected to lands 96 of daughter board 94.

Figure 9:
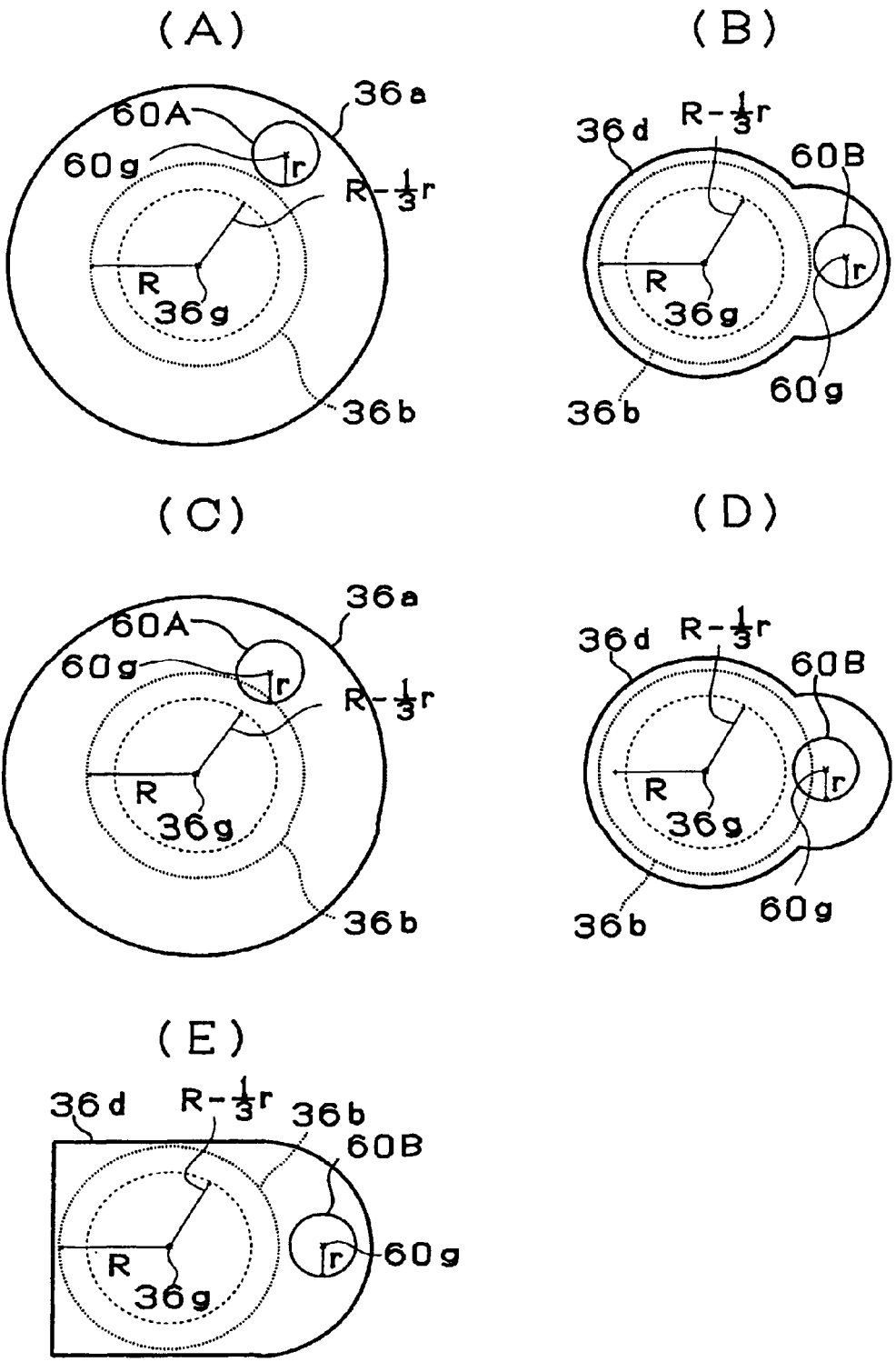
FIGS. 9(A) through 9(E) are plan views illustrating plated cover layers of a through-hole according to embodiments of the present invention.

FIG. 9(A) is a plan view of plated cover layer (through-hole land) (36a). Through-hole openings (also referred as "penetrating hole") 16 are formed to be 0.08 mm-0.25 mm using a drill. Plated cover layer (36a) is formed to be circular. When the radius of through-hole opening 16 is referred to as (R) and the bottom radius of via hole (60A) is referred to as (r), the bottom gravity center (60g) of via hole (60A) on plated cover layer (36a) is positioned on or beyond a circle having a radius of (R−r/3) measured from the gravity center (36g) of through-hole opening 16. The radius (R) of through-hole openings 16 is formed to be 50 μm and the radius (r) of via holes (60A) is formed to be 25 μm. On the other hand, the bottom radius (r3) of via holes 160 formed in interlaminar insulation layer 150, which is an upper layer over via holes (60A) shown in FIG. 7, is formed to be 22.5 μm. In addition, different positional configurations of plated cover layers (through-hole lands) 36 and first via holes are shown in FIGS. 9(C), 9(D) and 9(E).

FIG. 9(B) shows another configuration of a plated cover layer (through-hole land). Plated cover layer (36d) is shaped like a snowman by adjoining two partial circles (one with a smaller radius than the other and facing each other: hereinafter referred to as a "snowman"). The bottom gravity center (60g) of via hole (60B) on plated cover layer (36d), the same as in via hole (60A), is also positioned on or beyond a circle having a radius of (R−r/3) measured from gravity center (36g) of the through-hole opening 16 (also referred as "through-hole gravity center").

Regarding stresses built up during heat-cycle testing on via holes (60A, 60B) on plated cover layers (36a, 36d), as well as via holes 160 formed in the upper layers of the via holes, simulation testing was conducted. The results are described below. A 3D thermal stress simulation was conducted using a finite element method (FEM). When material having remarkable plasticity/creep characteristics such as solder or the like is contained in the analysis model, non-linear thermal stress simulation is required, taking plasticity/creep characteristics into consideration. First, the model including the entire substrate was analyzed using a coarse mesh. The calculated displacement was used as a boundary condition for the sub-model divided by a fine mesh, and using a multiscaling (sub-modeling) method for a precise analysis of the targeted portions, thermal stresses under thermal impact testing on micro-via in highly multilayered/highly dense organic packaging were analyzed. Namely, the coarse model in the packaging was analyzed, and the obtained displacement was set as a boundary condition for the sub-model, then, considering the plasticity of solder, non-linear thermal stress analysis under thermal impact testing conditions of −55° C. to 125° C. was conducted.

As a result, the following was found: On via holes (60A, 60B), formed on plated cover layers (36a, 36d), and whose gravity centers are positioned on or beyond a circle having a radius of (R−r/3) measured from the through-hole gravity center, 100 MPa is exerted; and on via holes (160) formed on the upper layers of the above via holes, 80 MPa is exerted.

Namely, on via holes (60A, 60B) on plated cover layers (36a, 36d), whose bottom gravity center (60g) is positioned on or beyond a circle having a radius of (R−r/3) measured from through-hole gravity center (36g), larger stresses build up at heat-cycle testing than on via holes 160 formed on second interlaminar resin insulation layers 150.

Therefore, bottom radius (r3) of via hole 160 formed on second interlaminar resin insulation layer 150 is made smaller than bottom radius (r) of via holes (60A, 60B) on plated cover layer (36a), whose gravity center is positioned on or beyond a circle having a radius of (R−r/3) measured from through-hole gravity center (36g). By such, the integration scale is raised using via holes having the smallest radius at each portion without lowering the connection reliability. For example, when the second via-hole radius is 30 μm or smaller, the through-hole opening radius is 100 μm or smaller, and the through-hole pitch is 385 μm or smaller, the foregoing embodiments according to the present invention may be employed in multilayered PWBs advantageously because if a core has smaller-radius through-holes with narrow pitches, the PWB tends to warp easily depending on environmental changes, and thus, stresses tend to concentrate on the second via holes.

In FIGS. 9(C), 9(D) and 9(E), different examples of plated cover layers (36a, 36d) are shown. However, as shown in FIGS. 9(C) and 9(E), the plated cover layers may not be shaped like a snowman. As is the case shown in FIG. 9(E), since plated cover layer (36d) protrudes from through-hole opening 16 in the direction where via hole (60A) is positioned, through-hole pitches may be set narrow, and thus high density may be achieved.

In the following, a method for manufacturing multilayered PWB 10 described above with reference to FIG. 7 is described with reference to FIGS. 1-6.

(1) On both surfaces of insulation substrate 30 made of 0.2-0.8 mm-thick glass-epoxy resin or BT (bismalimide triazone) resin, 5-250 μm-thick copper foil 32 is laminated to prepare copper-laminated layer (30A) as a starting material (FIG. 1(A)). First, by drilling the copper-laminated layer, penetrating holes 16 are bored (FIG. 1(B)), an electroless plating process or electrolytic plating process is performed, and side-wall conductive layers (36b) of through-holes 36 are formed (FIG. 1(C)). The opening diameter of penetrating holes 16 is formed 0.1-0.25 mmΦ by selecting a drill, and the pitch is made 0.15-0.575 mm.

(2) Substrate 30 having through-holes 36 is washed with water and dried. Then, a black oxide treatment with a black bath (oxide bath) using a solution containing NaOH (10 g/l), NaClO$_2$ (40 g/l) and Na$_3$PO$_4$ (6 g/l), and a reduction treatment with a reduction bath using a solution containing NaOH (10 g/l) and NaBH4 (6 g/l) are conducted. Accordingly, on sidewall conductive layers (36b) and surfaces of through-holes 36, roughened surfaces (36α) are formed (FIG. 1(D)).

(3) Next, filling agent 37 (non-conductive-filler copper paste with the brand name DD Paste, made by Tatsuta Electric Wire and Cable Co., Ltd.) containing copper particles with an average particle diameter of 10 μm is filled in through-holes 36 by screen-printing, then dried and set (FIG. 2(A)). Namely, a mask having openings in areas corresponding to through-holes is placed on the substrate, and then the filler is coated on the substrate by a printing method to fill through-holes, dried and set.

Then, excess filler 37 bulging from through-holes 36 is removed by belt-sander polishing using a #600 belt-sanding paper (made by Sankyo-Rikagaku Co., Ltd.). Further, to remove scratches made by the belt-sander polishing, buff-polishing is conducted to level out the surface of substrate 30 (see FIG. 2(B)). By doing so, substrate 30 is obtained, where side-wall conductive layers (36b) of through-holes 36 and resin filling agent 37 adhere firmly via roughened surfaces (36α).

(4) On the above-leveled surfaces of substrate 30, a palladium catalyst (made by Atotec Japan) is applied, then electroless copper plating is performed to form 0.6 μm-thick electroless copper-plated films 23 (FIG. 2(C)).

(5) In addition, electrolytic copper plating is performed under conditions shown below to form 15 μm-thick electrolytic copper-plated films 24. Accordingly, portions which later become conductive circuits 34 are thickened, and portions which later become plated cover layers (through-hole lands) covering filling agent 37 filled in through-holes 36 are formed (FIG. 2(D)).

| [electrolytic plating solution] | |
| --- | --- |
| sulfuric acid | 180 g/l |
| copper sulfate | 80 g/l |
| additive (brand name: Cupracid GL, made by Atotec Japan) | 1 ml/l |
| [electrolytic plating conditions] | |
| current density | 1 A/dm$^2$ |
| time | 70 minutes |
| temperature | at room temperature |

(6) On both surfaces of substrate 30 with formed portions which later become conductive circuits and plated cover layers, a commercially available photosensitive dry film is laminated, on which a patterned mask is placed, then exposed to light at 100 mJ/cm$^2$, developed with a 0.8%-sodium carbonate solution to form a 15 μm-thick etching resist 25 (see FIG. 2(E)). Plated cover layer configurations may be modified by adjusting the mask pattern.

(7) Portions of plated films 23, 24 and copper foil 32 where etching resist 25 is not formed are dissolved and removed using an etching solution mainly containing copper chloride (II), and then etching resist 25 is removed using a 5% KOH solution. Accordingly, independent conductive circuits 34 and plated cover layers (36a, 36d) covering filling agent 37 are formed (see FIG. 3(A)).

(8) Next, on each surface of conductive circuits 34 and plated cover layers (36a, 36d) covering filling agent 37, a 2.5 μm-thick roughened layer (concave-convex layer) (34β) made of a Cu—Ni—P alloy is formed. Furthermore, on each surface of roughened layers (34β), a 0.3 μm-thick Sn layer is formed (see FIG. 3(B)), but the Sn layers are not shown in the illustration.)

(9) On both substrate surfaces, a resin film for interlaminar resin insulation layer (brand name ABF-45SH, made by Ajinomoto Co., Inc.) (50γ) which is slightly larger than the substrate is placed, then preliminarily pressed and cut under conditions calling for pressure of 0.45 MPa, temperature of 80° C. and pressing time of 10 seconds. Then, using vacuum laminator equipment for the below process, interlaminar resin insulation layers 50 are formed (FIG. 3(C)). Namely, the resin film for the interlaminar resin insulation layer is pressed on the substrate under final pressing conditions calling for vacuum pressure of 67 Pa, pressure of 0.47 MPa, temperature of 85° C. and pressing time of 60 seconds, then thermoset at 170° C. for 40 minutes.

(10) Next, using a $CO_2$ laser under conditions of wavelength 10.4 μm, beam diameter 4.0 mm, tophat mode, pulse width 3-30μ second, mask through-hole diameter 1.0-5.0 mm and number of shots 1-3, via-hole openings 51 are formed in interlaminar resin insulation layers 2 (FIG. 3(D)). At plated cover layers (36a, 36d), the above laser conditions are adjusted to make the via-hole bottom radius 25 μm. Also, laser processing alignment marks are identified to process or modify according to alignment specifications so that the positions of bottom gravity centers are adjusted to be set for (R+1.2r).

(11) The substrate having via-hole openings 51 is immersed in an 80° C. solution containing permanganate 60 g/l for 10 minutes to remove particles on the surfaces of interlaminar resin insulation layers 2. Accordingly, roughened surfaces (50α) are formed on interlaminar resin insulation layers 50, including the inner walls of via-hole openings 51 (FIG. 4(A)).

(12) Next, the above-processed substrate is immersed in a neutralizer solution (made by Shipley Company) and washed with water. Furthermore, on the roughened surfaces (roughened depth 3 μm) of the above substrate, a palladium catalyst is applied and catalytic nuclei are adhered to interlaminar resin insulation layer surfaces and the inner walls of via-hole openings. Namely, the above substrate is immersed in a catalytic solution containing palladium chloride ($PdCl_2$) and tin (I) chloride ($SnCl_2$), and the catalyst is adhered by extracting palladium metal.

(13) Next, in electroless copper plating solution (Thru-Cup PEA) made by C. Uyemura & Co., Ltd., the substrate with adhered catalyst is immersed to form a 0.3-3.0 μm-thick electroless copper-plated film on the entire roughened surfaces. Accordingly, a substrate having electroless copper-plated films 52 formed on the surfaces of interlaminar resin insulation layers 50, including the inner walls of via hole openings 51, is obtained (FIG. 4(B)).

[Electroless Plating Conditions]
Solution Temperature at 34° C. for 45 Minutes

(14) On the substrate having electroless copper-plated films 52, a commercially available photosensitive dry film is laminated, on which a mask is placed, then the film is exposed to light at 110 mJ/cm$^2$ and developed in a 0.8% sodium carbonate solution, and 25 μm-thick plating resists 54 are formed (FIG. 4(C)).

(15) Then, after the substrate is washed with 50° C. water to remove grease, washed with 25° C. water and further cleaned with sulfuric acid, electrolytic plating is performed under the conditions below to form 15 μm-thick electrolytic copper-plated films 56 in areas where plating resists 54 are not formed (FIG. 5(A)).

| [electrolytic plating solution] | |
| --- | --- |
| sulfuric acid | 2.24 mol/l |
| copper sulfate | 0.26 mol/l |
| additive (Cupracid GL, made by Atotec Japan) | 19.5 ml/l |
| [electrolytic plating conditions] | |
| current density | 1 A/dm$^2$ |
| time | 70 minutes |
| temperature | 22 ± 2° C. |

(16) Furthermore, after plating resists 54 are removed using a 5% KOH solution, the electroless plated films underneath the plating resist are dissolved and removed by an etching process using a mixed solution of sulfuric acid and hydrogen peroxide. Consequently, independent conductive circuits 58 and via holes (60A, 60B) are formed (FIG. 5(B)).

(17) Then, the same procedure as the above step (4) is conducted to form roughened surfaces (58α) on the surfaces of conductive circuits 58 and via holes (60A, 60B). The thickness of lower conductive circuits 58 is made 15 μm (FIG. 5(C)). However, the thickness of lower conductive circuits 58 may be also made in the range of 5-25 μm.

(18) By repeating the above steps (9)-(17), interlaminar insulation layer 150 having conductive circuits 158 and via holes 160 is formed as a further upper layer. Accordingly, a multilayered PWB is obtained (FIG. 5(D)). The bottom radius of via holes 160 is adjusted to be 22.5 μm.

(19) Next, commercially available solder resist composition 70 is coated 20 μm thick on both surfaces of the multi-layered PWB, which is then dried under conditions of 70° C. for 20 minutes and 70° C. for 30 minutes. Then, 5 mm-thick photomasks having a printed pattern of solder-resist openings are adhered to solder-resist layers 70, which are then exposed to ultraviolet rays at 1,000 mJ/cm$^2$ and developed in a DMTG solution, to form openings 71 having a 200-μm diameter (FIG. 6(A)). Furthermore, heat-processing is conducted under conditions of 80° C. for an hour, 100° C. for an hour, 120° C. for an hour and 150° C. for three hours to thermoset the solder-resist layers. Accordingly, 15-25 μm-thick solder-resist pattern layers having openings are formed.

(20) Next, the substrate having solder-resist layers 70 is immersed for 20 minutes in a pH=4.5 electroless nickel plating solution containing nickel chloride (2.3×10$^{-1}$ mol/l), sodium hypophosphite (2.8×10$^{-1}$ mol/l) and sodium citrate (1.6×10$^{-1}$ mol/l) to form 5 μm-thick nickel-plated layers 72 in openings 71. The substrate is further immersed for 7.5 minutes at 80° C. in an electroless gold plating solution containing gold potassium cyanide (7.6×10$^{-3}$ mol/l), ammonium chloride (1.9×10$^{-1}$ mol/l), sodium citrate (1.2×10$^{-1}$ mol/l) and sodium hypophosphite (1.7×10$^{-1}$ mol/l) to form 0.03 μm-gold-plated layers 74 on nickel-plated layers 72 (FIG. 6(B)). Instead of nickel-gold layers, single layers using noble metals (gold, silver, palladium, platinum or the like) may be formed.

(21) After that, in openings 71 of solder-resist layers 70 formed on the substrate surface where an IC chip is mounted, a solder paste containing tin-lead is printed, and in openings of the solder-resist layers formed on the other substrate surface, a solder paste containing tin-antimony is printed. Then, solder bumps (solder body) are formed by a reflow process at 200° C. Accordingly, a multilayered PWB having solder bumps (78U, 78D) is produced (FIG. 7).

IC chip 90 is mounted via solder bumps (78U), and the multilayered PWB is mounted on daughter board 94 via solder bumps (78D) (FIG. 8).

In the following, First Examples 1-120 are described to verify the effects of multilayered PWB 10 according to the foregoing embodiments according to the present invention. First, bottom radiuses of via-holes on the lid-shaped conductive layers, bottom gravity center positions of the via holes on the lid-shaped conductive layers, bottom radiuses of second via holes, through-hole radiuses, through-hole pitches and others, and their relations to electrical resistance fluctuation rates after repeated heating and cooling is described. As shown in FIGS. 10-13, multilayered PWBs are produced according to First Examples 1-120 and First Comparative Examples 1-6 by modifying the above-described embodiments. Specifically, in reference to FIG. 1(B), the drill radius for drilling holes was adjusted to modify the radius of openings 16, and their pitches were modified by inputting positional drilling data into drilling equipment. In addition, bottom radiuses of the via holes on the lid-shaped conductive layers and bottom radiuses of second via holes were modified by adjusting laser conditions described in step (10), and bottom gravity center positions of the via holes on the lid-shaped conductive layers were modified by setting adjustment levels on the alignment mark position on the laser processing equipment as shown in step (10). IC chips were mounted on multilayered PWBs produced according to First Examples and First Comparative Examples, then sealing resin was filled between each IC chip and multilayered PWB to make IC mounted substrates. An electrical resistance value on a certain circuit through an IC chip (electrical resistance value between a pair of electrodes connected to the IC chip and exposed on the surface opposite the IC mounted surface of an IC mounted substrate) was measured and the value was set as an initial value. Then, on each IC mounted substrate, heat cycle testing was conducted by setting a cycle to be at −55° C. for five (5) minutes and 125° C. for five (5) minutes and repeating the cycle 2,000 times. At heat cycle testing, electrical resistance values were measured after the cycle was repeated 500 times, 1,000 times, 1,500 times, 1,750 times and 2,000 times, and each value was then compared with the initial value to obtain fluctuation ratios (100× (measured value−initial value)/initial value (%)). The results are shown in Tables 1-4.

TABLE 1

| # | thru-hole radius R(μm) | thru-hole pitch | via-hole radius (1st radius) on plated cover layer r(μm) | 2nd via-hole radius (2nd radius) (μm) | distance from thru-hole gravity center to via-hole bottom gravity center on plated cover layer | heat-cycle test results | | | | | 1st/2nd |
|---|---|---|---|---|---|---|---|---|---|---|---|
| | | | | | | 500 | 1000 | 1500 | 1750 | 2000 | |
| First Example 1 | 50 | 150 | 17.5 | 15 | R − ⅓r | ○ | ○ | Δ | X | X | 1.167 |
| First Example 2 | 50 | 150 | 17.5 | 15 | R + r | ○ | ○ | Δ | X | X | 1.167 |
| First Example 3 | 50 | 150 | 17.5 | 15 | R + 1.2r | ○ | ○ | Δ | X | X | 1.167 |
| First Example 4 | 50 | 150 | 17.5 | 15 | R + 2r | ○ | ○ | Δ | X | X | 1.167 |
| First Example 5 | 50 | 150 | 20 | 15 | R − ⅓r | ○ | ○ | Δ | Δ | X | 1.333 |
| First Example 6 | 50 | 150 | 20 | 15 | R + r | ○ | ○ | ○ | Δ | X | 1.333 |
| First Example 7 | 50 | 150 | 20 | 15 | R + 1.2r | ○ | ○ | ○ | ○ | ○ | 1.333 |
| First Example 8 | 50 | 150 | 20 | 15 | R + 2r | ○ | ○ | ○ | ○ | ○ | 1.333 |
| First Example 9 | 50 | 150 | 22.5 | 15 | R − ⅓r | ○ | ○ | ○ | Δ | X | 1.5 |
| First Example 10 | 50 | 150 | 22.5 | 15 | R + r | ○ | ○ | ○ | Δ | X | 1.5 |
| First Example 11 | 50 | 150 | 22.5 | 15 | R + 1.2r | ○ | ○ | ○ | ○ | ○ | 1.5 |
| First Example 12 | 50 | 150 | 22.5 | 15 | R + 2r | ○ | ○ | ○ | ○ | ○ | 1.5 |
| First Example 13 | 50 | 150 | 25 | 15 | R − ⅓r | ○ | ○ | ○ | Δ | X | 1.667 |
| First Example 14 | 50 | 150 | 25 | 15 | R + r | ○ | ○ | ○ | Δ | X | 1.667 |
| First Example 15 | 50 | 150 | 25 | 15 | R + 1.2r | ○ | ○ | ○ | ○ | ○ | 1.667 |
| First Example 16 | 50 | 150 | 25 | 15 | R + 2r | ○ | ○ | ○ | ○ | ○ | 1.667 |
| First Example 17 | 50 | 150 | 30 | 15 | R − ⅓r | ○ | ○ | Δ | X | X | 2 |

TABLE 1-continued

| # | thru-hole radius R(μm) | thru-hole pitch | via-hole radius (1st radius) on plated cover layer r(μm) | 2nd via-hole radius (2nd radius) (μm) | distance from thru-hole gravity center to via-hole bottom gravity center on plated cover layer | heat-cycle test results 500 | 1000 | 1500 | 1750 | 2000 | 1st/2nd |
|---|---|---|---|---|---|---|---|---|---|---|---|
| First Example 18 | 50 | 150 | 30 | 15 | R + r | ○ | ○ | △ | X | X | 2 |
| First Example 19 | 50 | 150 | 30 | 15 | R + 1.2r | ○ | ○ | △ | X | X | 2 |
| First Example 20 | 50 | 150 | 30 | 15 | R + 2r | ○ | ○ | △ | X | X | 2 |
| First Example 21 | 50 | 150 | 32.5 | 15 | R − ⅓r | ○ | ○ | △ | X | X | 2.167 |
| First Example 22 | 50 | 150 | 32.5 | 15 | R + r | ○ | ○ | △ | X | X | 2.167 |
| First Example 23 | 50 | 150 | 32.5 | 15 | R + 1.2r | ○ | ○ | △ | X | X | 2.167 |
| First Example 24 | 50 | 150 | 32.5 | 15 | R + 2r | ○ | ○ | △ | X | X | 2.167 |
| First Example 25 | 50 | 150 | 25 | 22.5 | R − ⅓r | ○ | ○ | △ | X | X | 1.111 |
| First Example 26 | 50 | 150 | 25 | 22.5 | R + r | ○ | ○ | △ | X | X | 1.111 |
| First Example 27 | 50 | 150 | 25 | 22.5 | R + 1.2r | ○ | ○ | △ | X | X | 1.111 |
| First Example 28 | 50 | 150 | 25 | 22.5 | R + 2r | ○ | ○ | △ | X | X | 1.111 |
| First Example 29 | 50 | 150 | 30 | 22.5 | R − ⅓r | ○ | ○ | ○ | △ | X | 1.333 |
| First Example 30 | 50 | 150 | 30 | 22.5 | R + r | ○ | ○ | ○ | △ | X | 1.333 |
| First Example 31 | 50 | 150 | 30 | 22.5 | R + 1.2r | ○ | ○ | ○ | ○ | ○ | 1.333 |
| First Example 32 | 50 | 150 | 30 | 22.5 | R + 2r | ○ | ○ | ○ | ○ | ○ | 1.333 |

TABLE 2

| # | thru-hole radius R(μm) | thru-hole pitch | via-hole radius (1st radius) on plated cover layer r(μm) | 2nd via-hole radius (2nd radius) (μm) | distance from thru-hole gravity center to via-hole bottom gravity center on plated cover layer | heat-cycle test results 500 | 1000 | 1500 | 1750 | 2000 | 1st/2nd |
|---|---|---|---|---|---|---|---|---|---|---|---|
| First Example 33 | 50 | 150 | 32.5 | 22.5 | R − ⅓r | ○ | ○ | ○ | △ | X | 1.444 |
| First Example 34 | 50 | 150 | 32.5 | 22.5 | R + r | ○ | ○ | ○ | △ | X | 1.444 |
| First Example 35 | 50 | 150 | 32.5 | 22.5 | R + 1.2r | ○ | ○ | ○ | ○ | ○ | 1.444 |
| First Example 36 | 50 | 150 | 32.5 | 22.5 | R + 2r | ○ | ○ | ○ | ○ | ○ | 1.444 |
| First Example 37 | 50 | 150 | 35 | 32.5 | R − ⅓r | ○ | ○ | △ | X | X | 1.077 |
| First Example 38 | 50 | 150 | 35 | 32.5 | R + r | ○ | ○ | △ | X | X | 1.077 |
| First Example 39 | 50 | 150 | 35 | 32.5 | R + 1.2r | ○ | ○ | △ | X | X | 1.077 |
| First Example 40 | 50 | 150 | 35 | 32.5 | R + 2r | ○ | ○ | △ | X | X | 1.077 |
| First Example 41 | 100 | 192.5 | 17.5 | 15 | R − ⅓r | ○ | ○ | △ | X | X | 1.167 |
| First Example 42 | 100 | 192.5 | 17.5 | 15 | R + r | ○ | ○ | △ | X | X | 1.167 |
| First Example 43 | 100 | 192.5 | 17.5 | 15 | R + 1.2r | ○ | ○ | △ | X | X | 1.167 |
| First Example 44 | 100 | 192.5 | 17.5 | 15 | R + 2r | ○ | ○ | △ | X | X | 1.167 |
| First Example 45 | 100 | 192.5 | 20 | 15 | R − ⅓r | ○ | ○ | ○ | △ | X | 1.333 |
| First Example 46 | 100 | 192.5 | 20 | 15 | R + r | ○ | ○ | ○ | △ | X | 1.333 |
| First Example 47 | 100 | 192.5 | 20 | 15 | R + 1.2r | ○ | ○ | ○ | ○ | ○ | 1.333 |
| First Example 48 | 100 | 192.5 | 20 | 15 | R + 2r | ○ | ○ | ○ | ○ | ○ | 1.333 |
| First Example 49 | 100 | 192.5 | 22.5 | 15 | R − ⅓r | ○ | ○ | ○ | △ | X | 1.5 |
| First Example 50 | 100 | 192.5 | 22.5 | 15 | R + r | ○ | ○ | ○ | △ | X | 1.5 |
| First Example 51 | 100 | 192.5 | 22.5 | 15 | R + 1.2r | ○ | ○ | ○ | ○ | ○ | 1.5 |
| First Example 52 | 100 | 192.5 | 22.5 | 15 | R + 2r | ○ | ○ | ○ | ○ | ○ | 1.5 |
| First Example 53 | 100 | 192.5 | 25 | 15 | R − ⅓r | ○ | ○ | ○ | △ | X | 1.667 |
| First Example 54 | 100 | 192.5 | 25 | 15 | R + r | ○ | ○ | ○ | △ | X | 1.667 |
| First Example 55 | 100 | 192.5 | 25 | 15 | R + 1.2r | ○ | ○ | ○ | ○ | ○ | 1.667 |
| First Example 56 | 100 | 192.5 | 25 | 15 | R + 2r | ○ | ○ | ○ | ○ | ○ | 1.667 |
| First Example 57 | 100 | 192.5 | 30 | 15 | R − ⅓r | ○ | ○ | △ | X | X | 2 |
| First Example 58 | 100 | 192.5 | 30 | 15 | R + r | ○ | ○ | △ | X | X | 2 |
| First Example 59 | 100 | 192.5 | 30 | 15 | R + 1.2r | ○ | ○ | △ | X | X | 2 |
| First Example 60 | 100 | 192.5 | 30 | 15 | R + 2r | ○ | ○ | △ | X | X | 2 |
| First Example 61 | 100 | 192.5 | 32.5 | 15 | R − ⅓r | ○ | ○ | △ | X | X | 2.167 |
| First Example 62 | 100 | 192.5 | 32.5 | 15 | R + r | ○ | ○ | △ | X | X | 2.167 |
| First Example 63 | 100 | 192.5 | 32.5 | 15 | R + 1.2r | ○ | ○ | △ | X | X | 2.167 |
| First Example 64 | 100 | 192.5 | 32.5 | 15 | R + 2r | ○ | ○ | △ | X | X | 2.167 |

TABLE 3

| # | thru-hole radius R(μm) | thru-hole pitch | via-hole radius (1st radius) on plated cover layer r(μm) | 2nd via-hole radius (2nd radius) (μm) | distance from thru-hole gravity center to via-hole bottom gravity center on plated cover layer | heat-cycle test results 500 | 1000 | 1500 | 1750 | 2000 | 1st/2nd |
|---|---|---|---|---|---|---|---|---|---|---|---|
| First Example 65 | 100 | 192.5 | 25 | 22.5 | R − ⅓r | ○ | ○ | Δ | X | X | 1.111 |
| First Example 66 | 100 | 192.5 | 25 | 22.5 | R + r | ○ | ○ | Δ | X | X | 1.111 |
| First Example 67 | 100 | 192.5 | 25 | 22.5 | R + 1.2r | ○ | ○ | Δ | X | X | 1.111 |
| First Example 68 | 100 | 192.5 | 25 | 22.5 | R + 2r | ○ | ○ | Δ | X | X | 1.111 |
| First Example 69 | 100 | 192.5 | 30 | 22.5 | R − ⅓r | ○ | ○ | ○ | Δ | X | 1.333 |
| First Example 70 | 100 | 192.5 | 30 | 22.5 | R + r | ○ | ○ | ○ | Δ | X | 1.333 |
| First Example 71 | 100 | 192.5 | 30 | 22.5 | R + 1.2r | ○ | ○ | ○ | ○ | ○ | 1.333 |
| First Example 72 | 100 | 192.5 | 30 | 22.5 | R + 2r | ○ | ○ | ○ | ○ | ○ | 1.333 |
| First Example 73 | 100 | 192.5 | 32.5 | 22.5 | R − ⅓r | ○ | ○ | ○ | Δ | X | 1.444 |
| First Example 74 | 100 | 192.5 | 32.5 | 22.5 | R + r | ○ | ○ | ○ | Δ | X | 1.444 |
| First Example 75 | 100 | 192.5 | 32.5 | 22.5 | R + 1.2r | ○ | ○ | ○ | ○ | ○ | 1.444 |
| First Example 76 | 100 | 192.5 | 32.5 | 22.5 | R + 2r | ○ | ○ | ○ | ○ | ○ | 1.444 |
| First Example 77 | 100 | 192.5 | 35 | 32.5 | R − ⅓r | ○ | ○ | Δ | X | X | 1.077 |
| First Example 78 | 100 | 192.5 | 35 | 32.5 | R + r | ○ | ○ | Δ | X | X | 1.077 |
| First Example 79 | 100 | 192.5 | 35 | 32.5 | R + 1.2r | ○ | ○ | Δ | X | X | 1.077 |
| First Example 80 | 100 | 192.5 | 35 | 32.5 | R + 2r | ○ | ○ | Δ | X | X | 1.077 |
| First Example 81 | 125 | 225 | 17.5 | 15 | R − ⅓r | ○ | ○ | Δ | X | X | 1.167 |
| First Example 82 | 125 | 225 | 17.5 | 15 | R + r | ○ | ○ | Δ | X | X | 1.167 |
| First Example 83 | 125 | 225 | 17.5 | 15 | R + 1.2r | ○ | ○ | Δ | X | X | 1.167 |
| First Example 84 | 125 | 225 | 17.5 | 15 | R + 2r | ○ | ○ | Δ | X | X | 1.167 |
| First Example 85 | 125 | 225 | 20 | 15 | R − ⅓r | ○ | ○ | ○ | Δ | X | 1.333 |
| First Example 86 | 125 | 225 | 20 | 15 | R + r | ○ | ○ | ○ | Δ | X | 1.333 |
| First Example 87 | 125 | 225 | 20 | 15 | R + 1.2r | ○ | ○ | ○ | ○ | ○ | 1.333 |
| First Example 88 | 125 | 225 | 20 | 15 | R + 2r | ○ | ○ | ○ | ○ | ○ | 1.333 |
| First Example 89 | 125 | 225 | 22.5 | 15 | R − ⅓r | ○ | ○ | ○ | Δ | X | 1.5 |
| First Example 90 | 125 | 225 | 22.5 | 15 | R + r | ○ | ○ | ○ | Δ | X | 1.5 |
| First Example 91 | 125 | 225 | 22.5 | 15 | R + 1.2r | ○ | ○ | ○ | ○ | ○ | 1.5 |
| First Example 92 | 125 | 225 | 22.5 | 15 | R + 2r | ○ | ○ | ○ | ○ | ○ | 1.5 |
| First Example 93 | 125 | 225 | 25 | 15 | R − ⅓r | ○ | ○ | ○ | Δ | X | 1.667 |
| First Example 94 | 125 | 225 | 25 | 15 | R + r | ○ | ○ | ○ | Δ | X | 1.667 |
| First Example 95 | 125 | 225 | 25 | 15 | R + 1.2r | ○ | ○ | ○ | ○ | ○ | 1.667 |
| First Example 96 | 125 | 225 | 25 | 15 | R + 2r | ○ | ○ | ○ | ○ | ○ | 1.667 |

TABLE 4

| # | thru-hole radius R(μm) | thru-hole pitch | via-hole radius (1st radius) on plated cover layer r(μm) | 2nd via-hole radius (2nd radius) (μm) | distance from thru-hole gravity center to via-hole bottom gravity center on plated cover layer | heat-cycle test results 500 | 1000 | 1500 | 1750 | 2000 | 1st/2nd |
|---|---|---|---|---|---|---|---|---|---|---|---|
| First Example 97 | 125 | 225 | 30 | 15 | R − ⅓r | ○ | ○ | Δ | X | X | 2 |
| First Example 98 | 125 | 225 | 30 | 15 | R + r | ○ | ○ | Δ | X | X | 2 |
| First Example 99 | 125 | 225 | 30 | 15 | R + 1.2r | ○ | ○ | Δ | X | X | 2 |
| First Example 100 | 125 | 225 | 30 | 15 | R + 2r | ○ | ○ | Δ | X | X | 2 |
| First Example 101 | 125 | 225 | 32.5 | 15 | R − ⅓r | ○ | ○ | Δ | X | X | 2.167 |
| First Example 102 | 125 | 225 | 32.5 | 15 | R + r | ○ | ○ | Δ | X | X | 2.167 |
| First Example 103 | 125 | 225 | 32.5 | 15 | R + 1.2r | ○ | ○ | Δ | X | X | 2.167 |
| First Example 104 | 125 | 225 | 32.5 | 15 | R + 2r | ○ | ○ | Δ | X | X | 2.167 |
| First Example 105 | 125 | 225 | 25 | 22.5 | R − ⅓r | ○ | ○ | Δ | X | X | 1.111 |
| First Example 106 | 125 | 225 | 25 | 22.5 | R + r | ○ | ○ | Δ | X | X | 1.111 |
| First Example 107 | 125 | 225 | 25 | 22.5 | R + 1.2r | ○ | ○ | Δ | X | X | 1.111 |
| First Example 108 | 125 | 225 | 25 | 22.5 | R + 2r | ○ | ○ | Δ | X | X | 1.111 |
| First Example 109 | 125 | 225 | 30 | 22.5 | R − ⅓r | ○ | ○ | ○ | Δ | X | 1.333 |
| First Example 110 | 125 | 225 | 30 | 22.5 | R + r | ○ | ○ | ○ | Δ | X | 1.333 |
| First Example 111 | 125 | 225 | 30 | 22.5 | R + 1.2r | ○ | ○ | ○ | ○ | ○ | 1.333 |
| First Example 112 | 125 | 225 | 30 | 22.5 | R + 2r | ○ | ○ | ○ | ○ | ○ | 1.333 |
| First Example 113 | 125 | 225 | 32.5 | 22.5 | R − ⅓r | ○ | ○ | ○ | Δ | X | 1.444 |
| First Example 114 | 125 | 225 | 32.5 | 22.5 | R + r | ○ | ○ | ○ | Δ | X | 1.444 |
| First Example 115 | 125 | 225 | 32.5 | 22.5 | R + 1.2r | ○ | ○ | ○ | ○ | ○ | 1.444 |
| First Example 116 | 125 | 225 | 32.5 | 22.5 | R + 2r | ○ | ○ | ○ | ○ | ○ | 1.444 |
| First Example 117 | 125 | 225 | 35 | 32.5 | R − ⅓r | ○ | ○ | Δ | X | X | 1.077 |
| First Example 118 | 125 | 225 | 35 | 32.5 | R + r | ○ | ○ | Δ | X | X | 1.077 |
| First Example 119 | 125 | 225 | 35 | 32.5 | R + 1.2r | ○ | ○ | Δ | X | X | 1.077 |
| First Example 120 | 125 | 225 | 35 | 32.5 | R + 2r | ○ | ○ | Δ | X | X | 1.077 |
| First Comp. Ex. 1 | 50 | 150 | 17.5 | 17.5 | R + 1.2r | Δ | X | X | X | X | 1 |
| First Comp. Ex. 2 | 50 | 150 | 35 | 35 | R + 1.2r | Δ | X | X | X | X | 1 |

TABLE 4-continued

| # | thru-hole radius R(μm) | thru-hole pitch | via-hole radius (1st radius) on plated cover layer r(μm) | 2nd via-hole radius (2nd radius) (μm) | distance from thru-hole gravity center to via-hole bottom gravity center on plated cover layer | heat-cycle test results | | | | | 1st/2nd |
|---|---|---|---|---|---|---|---|---|---|---|---|
| | | | | | | 500 | 1000 | 1500 | 1750 | 2000 | |
| First Comp. Ex. 3 | 100 | 192.5 | 17.5 | 17.5 | R + 1.2r | Δ | X | X | X | X | 1 |
| First Comp. Ex. 4 | 100 | 192.5 | 35 | 35 | R + 1.2r | Δ | X | X | X | X | 1 |
| First Comp. Ex. 5 | 125 | 225 | 17.5 | 17.5 | R + 1.2r | ○ | Δ | X | X | X | 1 |
| First Comp. Ex. 6 | 125 | 225 | 35 | 35 | R + 1.2r | ○ | Δ | X | X | X | 1 |

In the tables, if electrical resistance fluctuation ratios are within ±5%, they are indicated as "good" (○), if ±5~10%, as "average" (Δ), and if over ±10, as "inferior" (X). The fluctuation ratios of the target specification are within ±10% (namely, evaluated as "good" or "average"). Also, if the fluctuation ratios are within ±10%, they are considered as "passed."

The evaluation results show that First Examples 1-120 satisfied at least the target specification and after testing 1,500 times, the results were considered "passed." The parameters for First Examples 1-120 are: The bottom gravity centers of via holes on lid-shaped conductive layers are positioned on or beyond a circle having a radius of (R−r/3) measured from the through-hole gravity centers; and bottom radiuses of the via holes on lid-shaped conductive layers (hereinafter referred to as first radius) are made larger than bottom radiuses of the via holes (second via holes) formed in second interlaminar resin insulation layers (hereinafter referred to as second radius). (R: radius of through-hole opening, r: via-hole bottom radius on lid-shaped conductive layers). By comparison, the results of First Comparative Examples 1-6 were "average" or "inferior" during the target specification cycle, and after testing 1,500 times, all results were "inferior." The parameters for First Comparative Examples 1-6 are: The bottom gravity centers are positioned on or beyond a circle having a radius of (R−r/3) measured from through-hole gravity centers, but bottom radiuses of the via holes on lid-shaped conductive layers are the same as second radiuses. In First Comparative Examples 1-6, since the first radius and the second radius are the same, lower conductive layers (lands) 58 and second via holes adhere strongly against stresses. That is because stresses between lower conductive layers (lands) 58 and second via holes are small. Therefore, second via holes and surrounding resin insulation layers or the like seldom transform to relieve stresses. It is presumed that stresses from heating and cooling concentrate on areas between via-hole bottom portions on lid-shaped conductive layers and plated cover layers, and accordingly adhesiveness between via-hole bottom portions on lid-shaped conductive layers and plated cover layers is weakened, resulting in increased connection resistance.

Also, a comparison between First Comparative Examples 1-4 and First Comparative Examples 5 and 6 showed the following: When the first radius and the second radius were the same, but radiuses of through-hole openings and their pitches were formed in low density, the target specification was satisfied, whereas when the first radius and the second radius were the same, the through-hole radius was 100 μm or smaller and the pitch was 385 μm or less, the results were inferior after testing 1,000 times. It is presumed that the difference in results derived from the larger stresses generated in the latter case. As for the reason, referring to First Example 125 and First Comparative Example 6, in insulation substrate 30, through-hole conductor (copper: 16 ppm), whose thermal expansion rate is significantly different from that of the insulation substrate (thermal expansion rate: 50-60 ppm), is densely formed. Thus, it is presumed that multilayered PWBs may transform significantly. Therefore, it is found that employing the aforementioned embodiments of the present invention in multilayered PWBs where through-hole radiuses are 100 μm or smaller and their pitches are 385 μm or less is significant.

From the results of First Examples 1-120 after testing 1,500 times and 1,750 times, it is found that a value obtained by dividing the first radius by the second radius (first radius/second radius) is preferably in the range of 1.3-1.7. That is because within such a range, if adhesive power (adhesiveness per unit area×adhered area) between second via holes and lower conductive layers (lands) 58 is weaker than that between lid-shaped conductive layers and the via-hole bottoms on the lid-shaped conductive layers, since stresses between them are different, adhesive power/stresses are presumed to be the same (if there is difference between them, the stresses are concentrated on the weaker one, and thus problems such as exfoliation tend to occur in that portion.)

Furthermore, from the results of testing 1,750 times and 2,000 times, it is found that the preferred position for gravity centers of via holes on the lid-shaped conductive layers is at or beyond (R+1.2r). If the gravity centers of via holes on the lid-shaped conductive layers are positioned at or beyond (R+1.2r), all bottom portions of via holes are formed away from the through-holes and completely on the insulation substrate. Thus, it is presumed that they are not affected by through-holes. If they are close to through-holes, since physical properties (Young's modulus ratio, Poisson's ratio, thermal expansion coefficient, or the like) differ between through-holes and the substrate, it is presumed that further complex transformation occurs, and more stresses will transmit toward via holes on the lid-shaped conductive layers.

To shorten wiring length, if a structure featuring via holes formed on plated cover layers is employed, via-hole reliability tends to be lowered, and it is difficult to decrease via-hole diameters. Generally, when the via-hole bottom diameter is decreased, the contact area between the conductors formed in via holes and the lower-layer conductors (lands) decreases. Accordingly, the adhesiveness between the via holes and the lands is lowered, and when heat-cycle testing is conducted, it has been observed that connection resistances between the two tend to increase.

In a built-up PWB, via holes are formed by forming electrolytic plated films after electroless plated films have been formed. Since the first-formed electroless plated films contain organic matter, hydrogen molecules, hydrogen atoms and the like, and thus are fragile, presumably cracks tend to occur at the electroless plated films. Also, since electroless plated films are low in ductility, it is presumed that if a PWB is warped when IC chips are mounted, electroless plated films cannot follow the warping and can be easily separated from the lands.

It has been found that via-hole reliability tends to decrease in certain sections of a multilayered PWB. From simulation testing, it has been found that in via holes formed on lid-shaped conductors (plated cover layers), most bottom portions of which are formed in areas excluding portions above through-holes, more stresses build up at heat-cycle testing than in via holes (second via holes) formed on the second interlaminar resin insulation layers.

However, according to the foregoing embodiments of the present invention, where the radius of a through-hole opening is referred to as (R) and the radius of a via hole formed on a plated cover layer as (r), the bottom radius of the via hole on the lid-shaped conductive layer (plated cover layer), whose gravity center is on or beyond a circle having a radius of (R−r/3) measured from the gravity center of the through-hole opening, is made larger than the bottom radius of a via hole formed in the second interlaminar resin insulation layer. By doing so, while using via holes having small diameters and raising the integration scale, the connection reliability is kept from being reduced.

If via holes are not made circular, but are made elliptic or polygonal, (r) is set as half of a straight line connecting both peripheral ends (the farthest two points). The same with through-hole openings. For example, if it is elliptic, (r) is half of its major axis, and if it is rectangular, (r) is half the diagonal.

Figure 12:
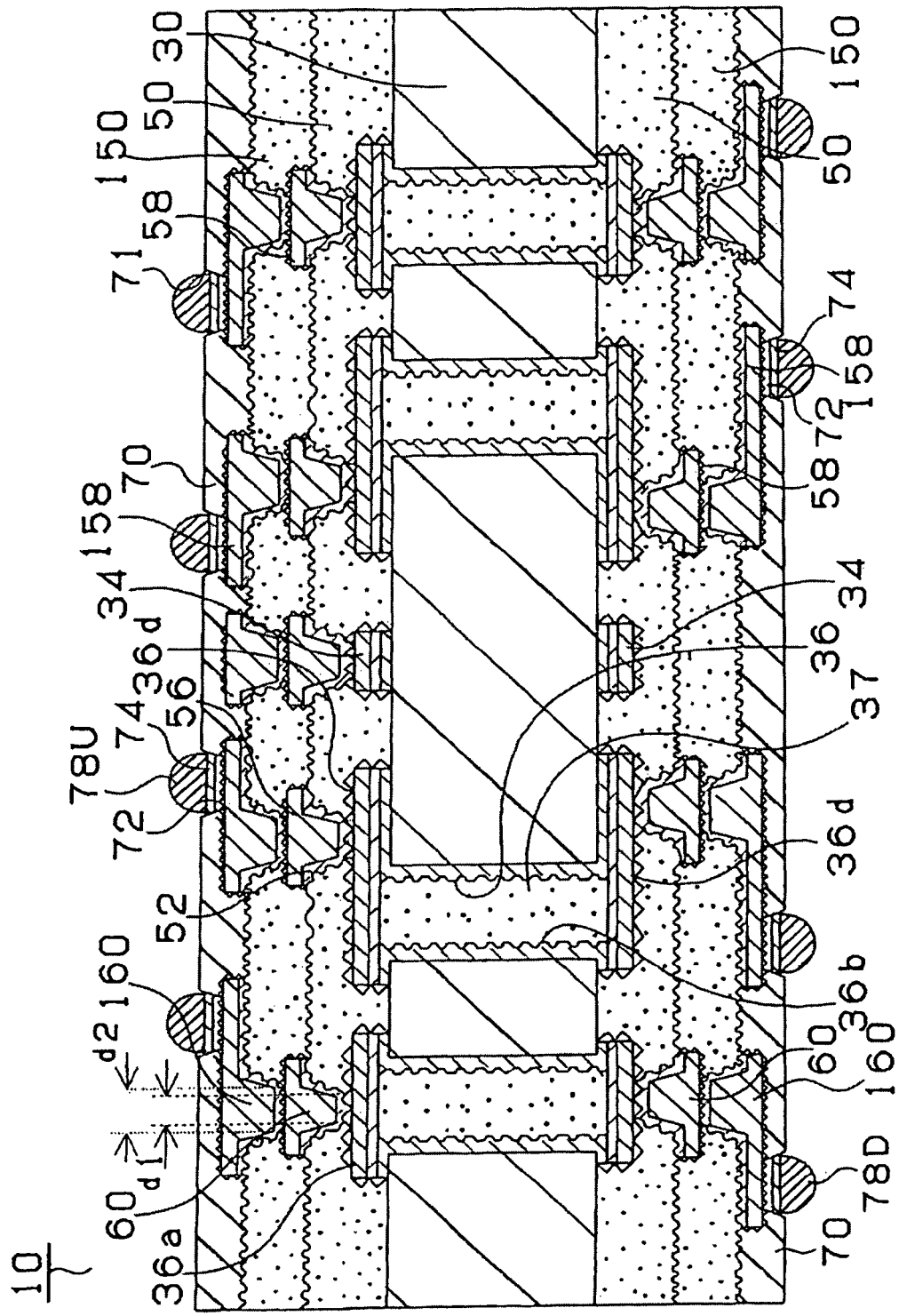
FIG. 12 is a cross-sectional view of a multilayered PWB according to an embodiment of the present invention related to FIGS. 10-11.
Figure 13:
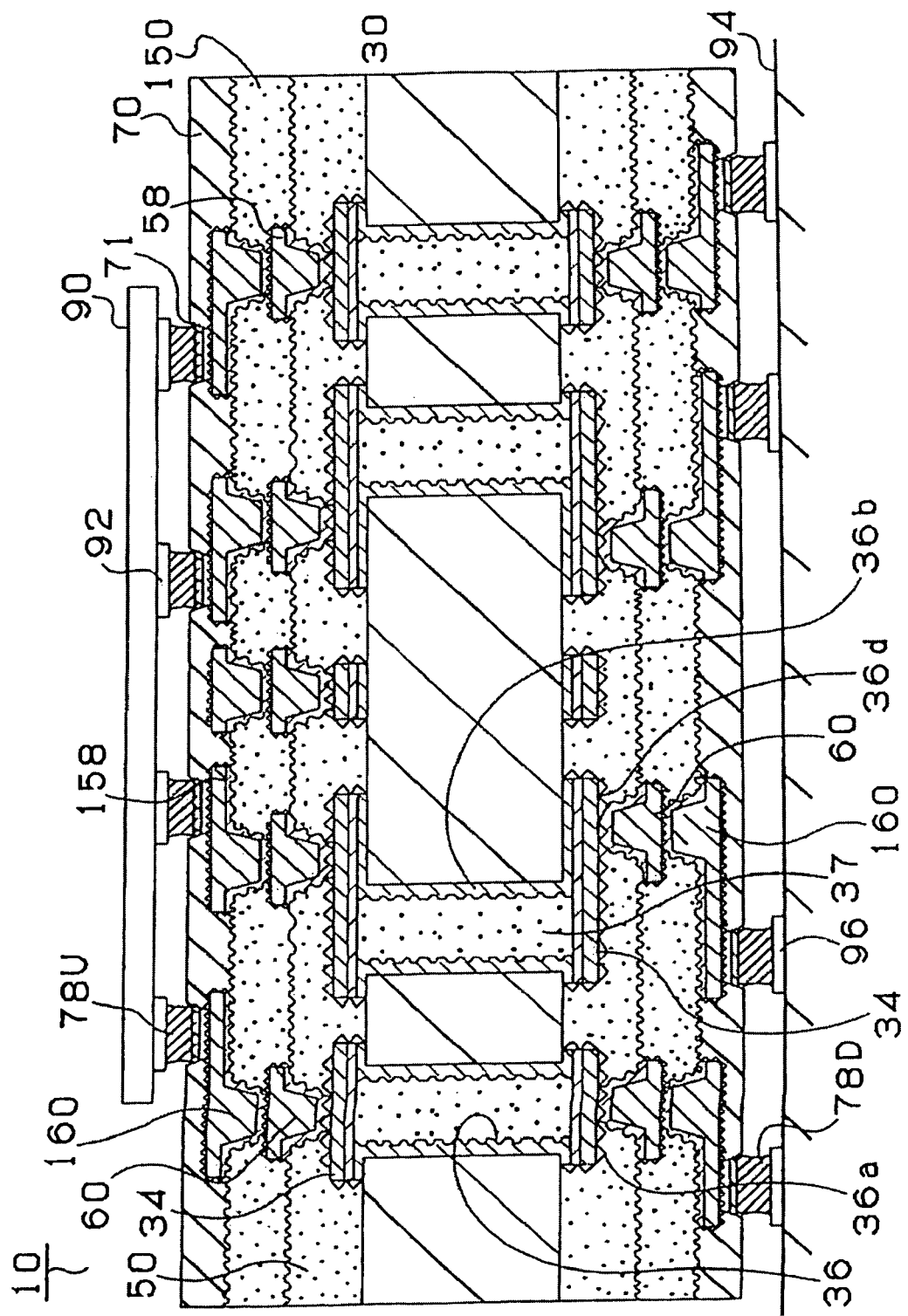
FIG. 13 is a cross-sectional view illustrating the multilayered PWB of FIG. 12 with a mounted IC chip.

Next, a multilayered PWB 10 according to another embodiment of the present invention is described with reference to FIGS. 12-13. FIG. 12 is a cross-sectional view of multilayered PWB 10, and FIG. 13 is a view illustrating multilayered PWB 10 shown in FIG. 12 with mounted IC chip 90 mounted on daughter board 94. As shown in FIG. 12, in multilayered PWB 10, conductive circuits 34 are formed on the surfaces of core substrate 30. The upper surface and lower surface of core substrate 30 are connected via through-holes 36. Through-holes 36 have plated cover layers (36a, 36d), which make up through-hole lands, and side-wall conductive layers (36b). The area enveloped by side-wall conductive layers (36b) is filled with resin filler 37. On plated cover layers (through-hole lands) (36a, 36d), interlaminar resin insulation layers 50 having filled vias 60 and conductive circuits 58, as well as interlaminar resin insulation layers 150 having filled vias 160 and conductive circuits 158 are formed. As an upper layer over filled vias 160 and conductive circuits 158, solder-resist layer 70 is formed. Through openings 71 of solder-resist layers 70, bumps (78U, 78D) are formed over filled vias 160 and conductive circuits 158.

As shown in FIG. 13, solder bumps (78U) on the upper surface of multilayered PWB 10 are connected to lands 92 of IC chip 90. On the other hand, solder bumps (78D) on the lower surface are connected to lands 96 of daughter board 94.

Figure 14:
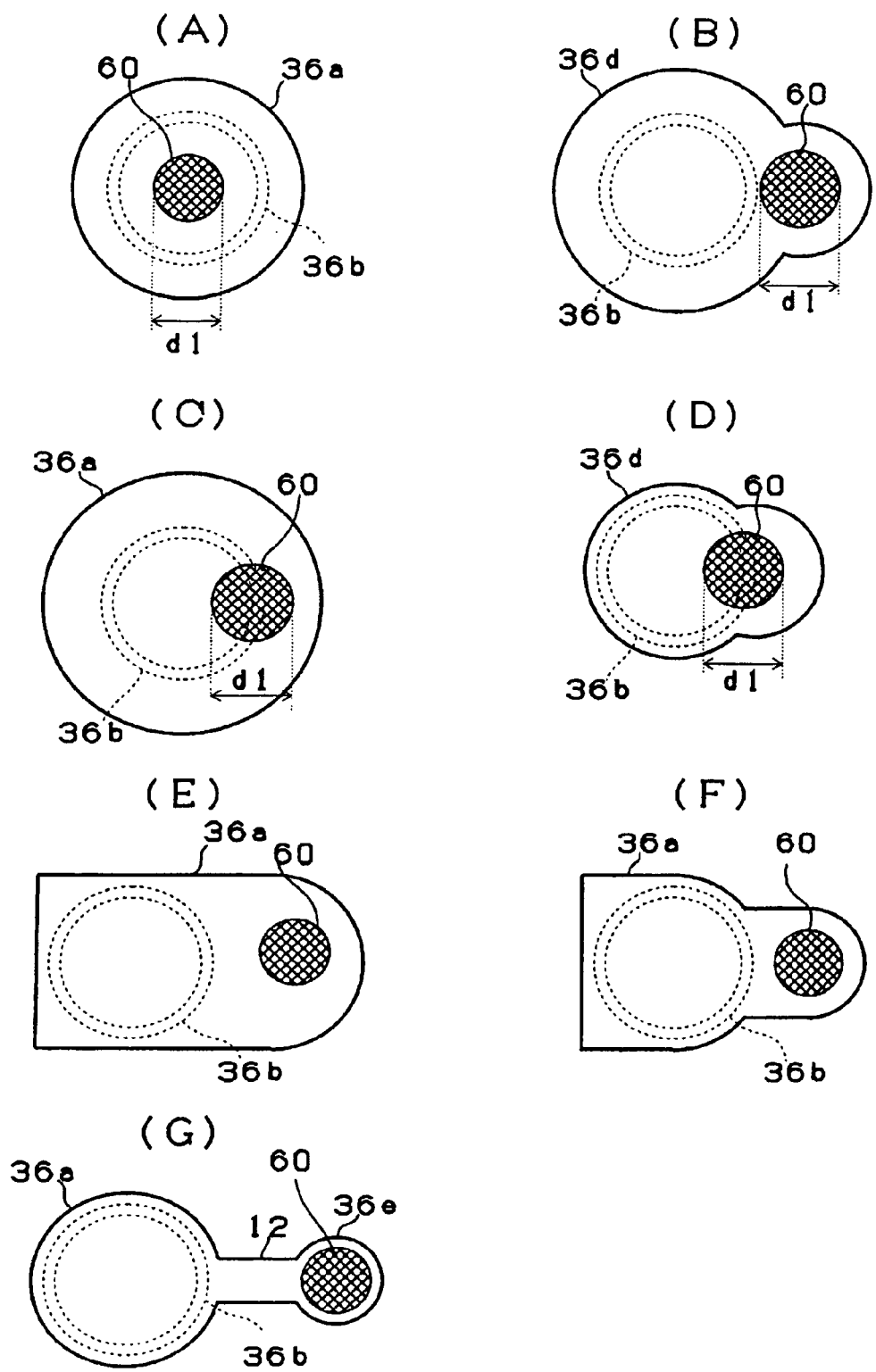
FIGS. 14(A) through 14(G) are plan views illustrating plated cover layers of through-holes according to embodiments of the present invention.
Figure 15:
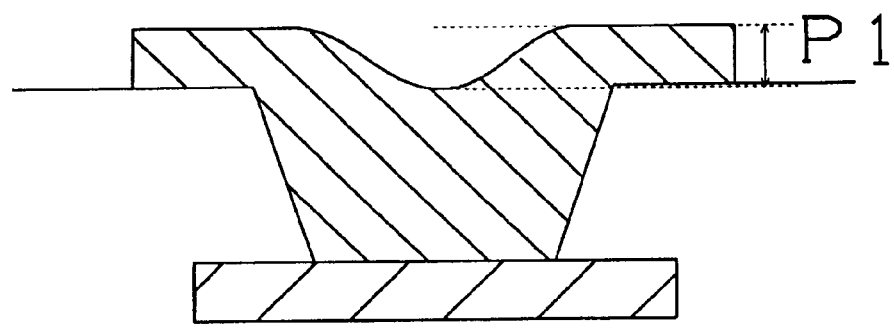
FIGS. 15(A) through 15(B) are views illustrating filled via structures according to embodiments of the present invention.
Figure 15:
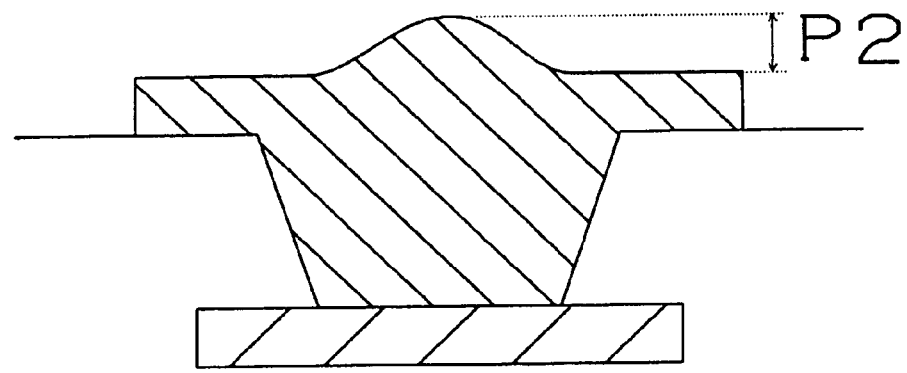

FIG. 14(A) is a plan view of plated cover layer (through-hole land) (36a). The through-hole opening is formed to be 0.08 mm-0.25 mm using a drill. Plated cover layer (36a) is formed to be circular. The bottom portion of filled via 60 on plated cover layer (36a) is formed inside side-wall conductive layer (36b), and is formed to have diameter (d1) of 45 μm. On the other hand, filled via 160 formed in interlaminar insulation layer 150, which is formed as an upper layer over filled via 60 shown in FIG. 15, has bottom diameter (d2) of 60 μm.

FIG. 14(B) is a plan view of plated cover layer (through-hole land) (36d). Plated cover layer (36d) is shaped like a snowman by adjoining two partial circles. The bottom portion of filled via 60 on plated cover layer (36d) is formed in an area which is not over the through-hole. The bottom portion of filled via 60 is formed to have diameter (d1) of 45 μm. On the other hand, filled via 160 formed directly over filled via 60 shown in FIG. 12 is formed to have diameter (d2) of 60 μm. As shown in FIGS. 14(E) and 14(F), plated cover layers may not be part of a circle. As shown in those examples, if the plated cover layer is formed to have a laterally protruding portion only where a filled via is formed, through-holes may be formed with a narrow pitch. Also, instead of being filled with filler material, through-holes may be filled with the same material as the side-wall conductive layer.

Regarding stresses exerted during heat-cycle testing to filled vias 60 on cover layers (36d), as well as filled vias 160 formed directly on the filled vias, simulation testing was conducted. The results are described below. Here, a 3D thermal stress simulation was conducted using a finite element method (FEM). When material having remarkable plasticity/creep characteristics such as solder or the like is contained in the analysis model, non-linear thermal stress simulation is required, taking plasticity/creep characteristics into consideration. First, the model including the entire substrate was analyzed using a coarse mesh. The calculated displacement was used as a boundary condition for the submodel divided by a fine mesh, and using a multiscaling (submodeling) method for a precise analysis of the targeted portions, thermal stresses under thermal impact testing on micro-via in highly multilayered/highly dense organic packaging were analyzed. Namely, the coarse model in the packaging was analyzed, and the obtained displacement was set as a boundary condition for the sub-model, then, considering the plasticity of solder, non-linear thermal stress analysis under thermal impact testing conditions of −55° C. to 5° C. at the Second Comparative Examples was conducted.

As a result, the following was found: On the bottom portions of filled vias 60 formed on plated cover layers (36d), 100 MPa is exerted; and on the bottom portions of filled vias 160 formed on the upper layer of the above filled vias 60, 130 MPa is exerted.

Namely, on the bottom portions of filled vias 60 formed on lid-shaped conductive layers (plated cover layers) (36d), smaller stresses build up at heat-cycle testing than on the bottom portions of filled vias 160 formed on second interlaminar resin insulations layers 150.

Therefore, in the aforementioned embodiments of the present invention, bottom diameter (d1) of filled vias 60 formed on lid-shaped conductive layers (plated cover layers) (36a, 36d) is made smaller than bottom diameter (d2) of filled vias 160 formed directly over filled vias 60. By such, the integration scale is raised using filled vias having the smallest diameter at each portion without lowering connection reliability.

In FIGS. 14(C) and 14(D), different configuration examples of plated cover layers are shown. Referring to FIG. 14(C), in circular plated cover layer (36a), filled via 60 is formed on side-wall conductive layer (36b). Referring to FIG. 14(D), in plated cover layer (36d) shaped like a snowman, filled via 60 is formed above side-wall conductive layer (36b). FIG. 14(G) shows a different configuration of filled via on land (36e), where land (36e) of filled via, plated cover layer (36a) and through-hole side-wall conductive layer (36b) are connected by wiring 12. In such a case, filled via 60 is preferably made larger than the diameter of filled via 160, considering the connection reliability.

Figure 10:
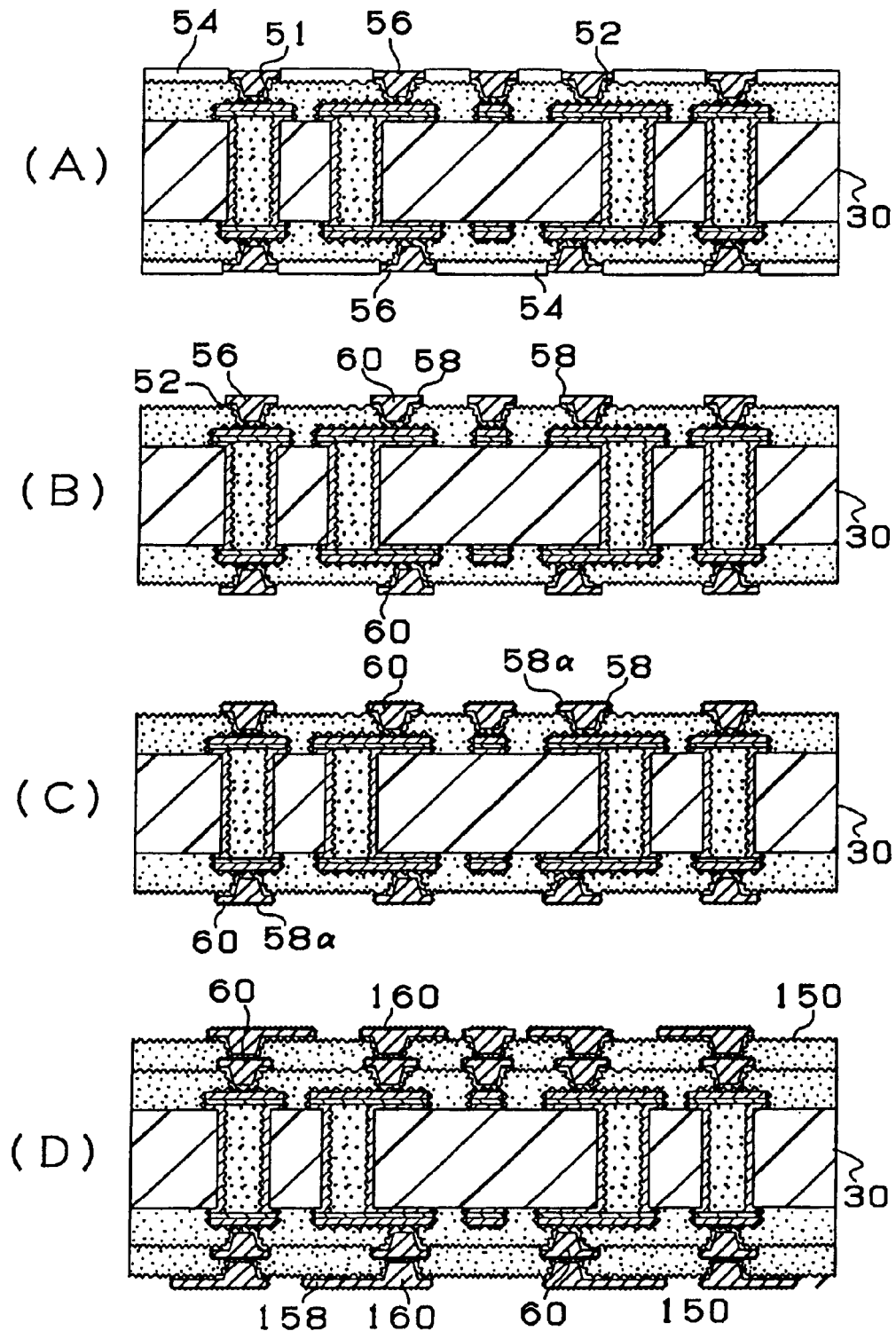
FIGS. 10(A) through 10(D) are views illustrating manufacturing steps of a multilayered PWB according to another embodiment of the present invention.
Figure 11:
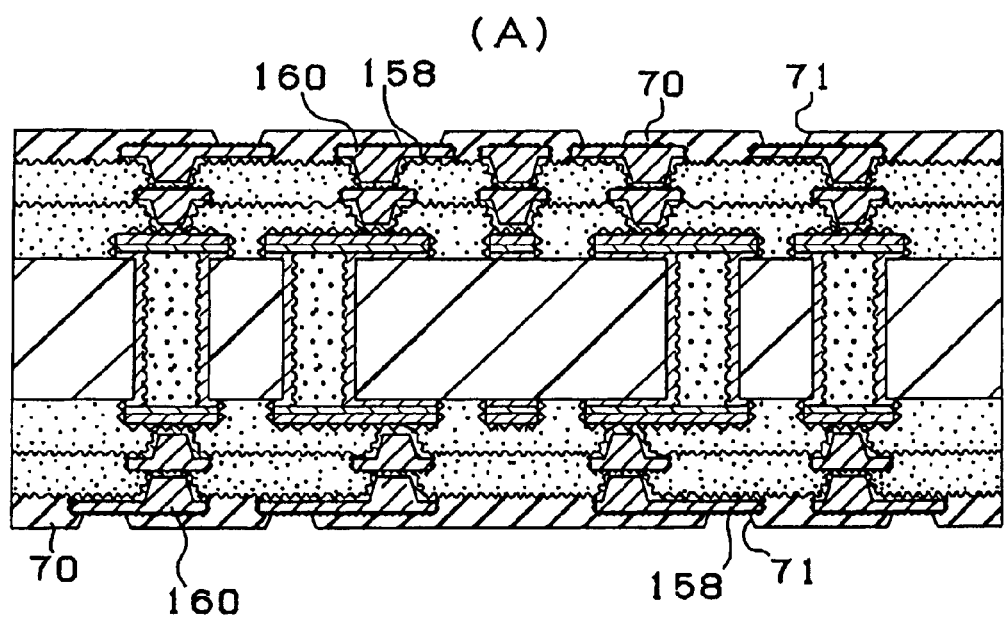
FIGS. 11(A) through 11(B) are views illustrating manufacturing steps of the multilayered PWB following FIG. 11(B)
Figure 11:
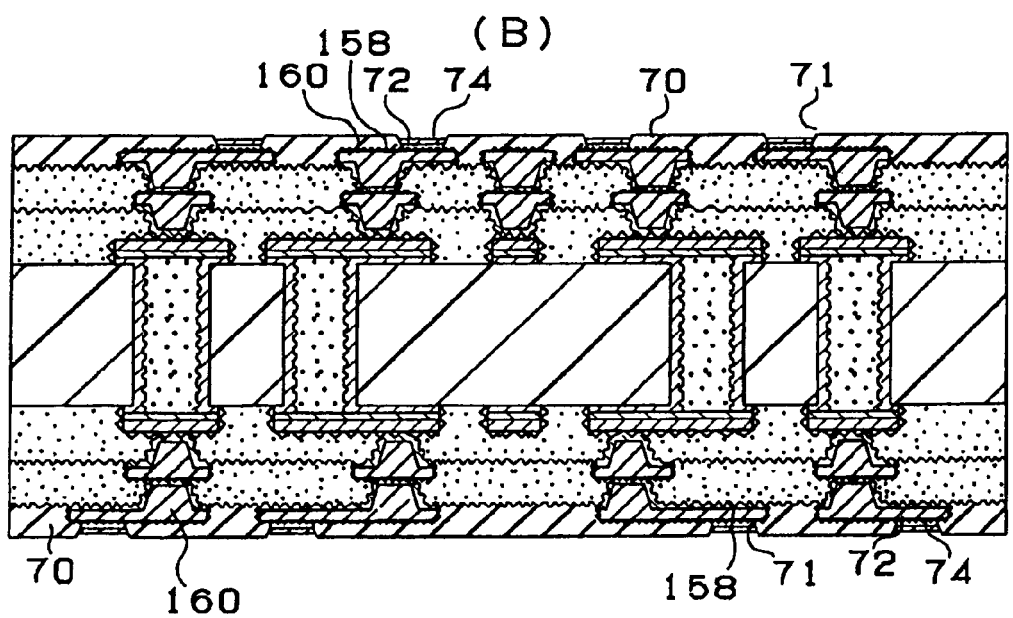

In the following, a method for manufacturing multilayered PWB 10 described above with reference to FIG. 13 is described with reference to FIGS. 10-11. Since steps (1)-(14) described in the embodiments with reference to FIGS. 1-4 are the same in this embodiments, illustrations and description are omitted, and the description is started from a formation step for electrolytic plated films 56.

(15) After the substrate is washed with 50° C. water to remove grease, washed with 25° C. water and further cleaned with sulfuric acid, electrolytic plating is performed under the conditions below to form electrolytic copper-plated films 56 (FIG. 10(A)).

| [electrolytic plating solution] | |
|---|---|
| sulfuric acid | 2.24 mol/l |
| copper sulfate | 0.26 mol/l |
| additive | 19.5 ml/l |
| leveling agent | 50 mg/l |
| gloss agent | 50 mg/l |
| [electrolytic plating conditions] | |
| current density | 1 A/dm² |
| time | 70 minutes |
| temperature | 22 ± 2° C. |

(16) Furthermore, after plating resist 54 is removed using a 5% KOH solution, the electroless plated film underneath the plating resist is dissolved and removed by an etching process using a mixed solution of sulfuric acid and hydrogen peroxide. Consequently, independent conductive circuits 58 and filled vias 60 are formed (FIG. 10(B)).

(17) Then, the same procedure as the above step (4) is conducted to form roughened surfaces (58α) on the surfaces of conductive circuits 58 and filled vias 60. The thickness of upper conductive circuits 58 is made 15 μm (FIG. 10(C)). However, the thickness of upper conductive circuits 58 also may be made in the range of 5-25 μm.

(18) By repeating the above steps (9)-(17), interlaminar insulation layer 150 having conductive circuits 158 and filled vias 160 is formed as a further upper layer. Accordingly, a multilayered PWB is obtained (FIG. 10(D)). Here, the bottom diameter of filled vias 160 is adjusted to be 60 μm.

(19) Next, on both surfaces of the multilayered PWB, commercially available solder resist composition 70 is coated 20 μm thick, and solder resist layers having openings 71 with a 200-μm diameter are formed as in the previous embodiments (FIG. 11(A)).

(20) Next, by the same procedure as in the previous embodiments, 5-μm nickel-plated layers 72 and 0.03-μm gold-plated layers 74 are formed in openings 71 (FIG. 11(B)).

(21) After that, in openings 71 of solder-resist layers 70 formed on the substrate surface where an IC chip is mounted, a solder paste containing tin-lead is printed, and in openings of the solder-resist layers formed on the other substrate surface, a solder paste containing tin-antimony is printed. Then, solder bumps (solder body) are formed by a reflow process at 200° C. Accordingly, a multilayered PWB having solder bumps (78U, 78D) is produced (FIG. 12).

IC chip 90 is mounted via solder bumps (78U), and the multilayered PWB is mounted on daughter board 94 via solder bumps (78D) (FIG. 13).

In the following, Second Examples 1-240 are described to verify the effects of multilayered PWB 10 according to the foregoing embodiments of the present invention. First, bottom diameters of first filled vias, bottom diameters of second filled vias, and land configurations of first filled vias are changed (see FIG. 14); in addition, the positions where first filled vias are formed ((i) on a plated cover layer and directly over a through-hole opening (see FIG. 14(A)), (ii) on land (36e) (see FIG. 14(G)), (iii) on a plated cover layer, excluding the area directly over the through-hole opening (see FIG. 14(B)), or (iv) on plated cover layer and on side-wall conductive layer (see FIGS. 14(C), 14(D)) are changed to produce multilayered PWBs. Then, electrical resistance fluctuation rates after repeated heating and cooling on each PWB are described. As shown in Tables 5-8, multilayered PWBs are produced according to Second Examples 1-120, and Second Comparative Examples 1-6 by modifying the above-described embodiments of the present invention. Specifically, in reference to FIG. 1(B), the drill radius for drilling holes was adjusted to modify the radius of openings 16, and their pitches were modified by inputting positional drilling data into drilling equipment. In addition, bottom diameters of first filled vias and second filled vias were modified by adjusting laser conditions described in step (10), and their positions were determined by inputting positional via-hole-opening data into laser processing equipment according to land configurations of the filled via and their positions on lands. Land configurations of first filled vias were modified by adjusting a mask pattern as described in step (6) with reference to FIG. 2(E). IC chips were mounted on multilayered PWBs produced according to each Second Example and Second Comparative Example, then sealing resin was filled between each IC chip and multilayered PWB to make IC mounted substrates. An electrical resistance value on a certain circuit through an IC chip (electrical resistance value between a pair of electrodes connected to the IC chip and exposed in the surface opposite the IC mounted surface of an IC mounted substrate) was measured and the value was set as an initial value. Then, on each IC mounted substrate, heat cycle testing was conducted by setting a cycle at −55° C. for five (5) minutes, for the Second Comparative Examples at 5° C. for five (5) minutes, and repeating the cycle 2,500 times. At heat cycle testing, electrical resistance values were measured after the cycle was repeated 500 times, 1,000 times, 1,250 times, 1,500 times, 1,750 times, 2,000 times and 2,500 times, and then each value was compared with the initial value to obtain fluctuation ratios (100×(measured value−initial value)/initial value (%)). The results are shown in Tables 5-8.

TABLE 5

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Example 1 | 50 | 150 | 30 | 35 | (i) | ○ | ○ | ○ | ○ | ○ | ○ | X | 1.167 |
| Second Example 2 | 50 | 150 | 30 | 35 | (ii) | ○ | ○ | Δ | Δ | X | X | X | 1.167 |
| Second Example 3 | 50 | 150 | 30 | 35 | (iii) | ○ | ○ | ○ | ○ | Δ | X | X | 1.167 |
| Second Example 4 | 50 | 150 | 30 | 35 | (iv) | ○ | ○ | Δ | X | X | X | X | 1.167 |
| Second Example 5 | 50 | 150 | 30 | 40 | (i) | ○ | ○ | ○ | ○ | ○ | ○ | ○ | 1.333 |
| Second Example 6 | 50 | 150 | 30 | 40 | (ii) | ○ | ○ | Δ | Δ | X | X | X | 1.333 |
| Second Example 7 | 50 | 150 | 30 | 40 | (iii) | ○ | ○ | ○ | ○ | Δ | X | X | 1.333 |

TABLE 5-continued

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Example 8 | 50 | 150 | 30 | 40 | (iv) | ○ | ○ | △ | X | X | X | X | 1.333 |
| Second Example 9 | 50 | 150 | 30 | 45 | (i) | ○ | ○ | ○ | ○ | ○ | ○ | ○ | 1.5 |
| Second Example 10 | 50 | 150 | 30 | 45 | (ii) | ○ | ○ | △ | △ | X | X | X | 1.5 |
| Second Example 11 | 50 | 150 | 30 | 45 | (iii) | ○ | ○ | ○ | ○ | △ | X | X | 1.5 |
| Second Example 12 | 50 | 150 | 30 | 45 | (iv) | ○ | ○ | △ | X | X | X | X | 1.5 |
| Second Example 13 | 50 | 150 | 30 | 50 | (i) | ○ | ○ | ○ | ○ | ○ | ○ | ○ | 1.667 |
| Second Example 14 | 50 | 150 | 30 | 50 | (ii) | ○ | ○ | △ | △ | X | X | X | 1.667 |
| Second Example 15 | 50 | 150 | 30 | 50 | (iii) | ○ | ○ | ○ | ○ | △ | X | X | 1.667 |
| Second Example 16 | 50 | 150 | 30 | 50 | (iv) | ○ | ○ | △ | X | X | X | X | 1.667 |
| Second Example 17 | 50 | 150 | 30 | 60 | (i) | ○ | ○ | ○ | ○ | ○ | ○ | X | 2 |
| Second Example 18 | 50 | 150 | 30 | 60 | (ii) | ○ | ○ | △ | △ | X | X | X | 2 |
| Second Example 19 | 50 | 150 | 30 | 60 | (iii) | ○ | ○ | ○ | ○ | △ | X | X | 2 |
| Second Example 20 | 50 | 150 | 30 | 60 | (iv) | ○ | ○ | △ | X | X | X | X | 2 |
| Second Example 21 | 50 | 150 | 30 | 65 | (i) | ○ | ○ | ○ | ○ | ○ | ○ | X | 2.167 |
| Second Example 22 | 50 | 150 | 30 | 65 | (ii) | ○ | ○ | △ | △ | X | X | X | 2.167 |
| Second Example 23 | 50 | 150 | 30 | 65 | (iii) | ○ | ○ | ○ | ○ | △ | X | X | 2.167 |
| Second Example 24 | 50 | 150 | 30 | 65 | (iv) | ○ | ○ | △ | X | X | X | X | 2.167 |
| Second Example 25 | 50 | 150 | 45 | 50 | (i) | ○ | ○ | ○ | ○ | ○ | ○ | X | 1.111 |
| Second Example 26 | 50 | 150 | 45 | 50 | (ii) | ○ | ○ | △ | △ | X | X | X | 1.111 |
| Second Example 27 | 50 | 150 | 45 | 50 | (iii) | ○ | ○ | ○ | ○ | △ | X | X | 1.111 |
| Second Example 28 | 50 | 150 | 45 | 50 | (iv) | ○ | ○ | △ | X | X | X | X | 1.111 |
| Second Example 29 | 50 | 150 | 45 | 60 | (i) | ○ | ○ | ○ | ○ | ○ | ○ | ○ | 1.333 |
| Second Example 30 | 50 | 150 | 45 | 60 | (ii) | ○ | ○ | △ | △ | X | X | X | 1.333 |
| Second Example 31 | 50 | 150 | 45 | 60 | (iii) | ○ | ○ | ○ | ○ | △ | X | X | 1.333 |
| Second Example 32 | 50 | 150 | 45 | 60 | (iv) | ○ | ○ | △ | X | X | X | X | 1.333 |
| Second Example 33 | 50 | 150 | 45 | 65 | (i) | ○ | ○ | ○ | ○ | ○ | ○ | ○ | 1.444 |

TABLE 6

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Example 34 | 50 | 150 | 45 | 65 | (ii) | ○ | ○ | △ | △ | X | X | X | 1.444 |
| Second Example 35 | 50 | 150 | 45 | 65 | (iii) | ○ | ○ | ○ | ○ | △ | X | X | 1.444 |
| Second Example 36 | 50 | 150 | 45 | 65 | (iv) | ○ | ○ | △ | X | X | X | X | 1.444 |
| Second Example 37 | 50 | 150 | 65 | 70 | (i) | ○ | ○ | ○ | ○ | ○ | ○ | X | 1.077 |
| Second Example 38 | 50 | 150 | 65 | 70 | (ii) | ○ | ○ | △ | △ | X | X | X | 1.077 |
| Second Example 39 | 50 | 150 | 65 | 70 | (iii) | ○ | ○ | ○ | ○ | △ | X | X | 1.077 |
| Second Example 40 | 50 | 150 | 65 | 70 | (iv) | ○ | ○ | △ | X | X | X | X | 1.077 |
| Second Example 41 | 100 | 192.5 | 30 | 35 | (i) | ○ | ○ | ○ | ○ | ○ | ○ | X | 1.167 |
| Second Example 42 | 100 | 192.5 | 30 | 35 | (ii) | ○ | ○ | △ | △ | X | X | X | 1.167 |
| Second Example 43 | 100 | 192.5 | 30 | 35 | (iii) | ○ | ○ | ○ | ○ | △ | X | X | 1.167 |
| Second Example 44 | 100 | 192.5 | 30 | 35 | (iv) | ○ | ○ | △ | X | X | X | X | 1.167 |
| Second Example 45 | 100 | 192.5 | 30 | 40 | (i) | ○ | ○ | ○ | ○ | ○ | ○ | ○ | 1.333 |
| Second Example 46 | 100 | 192.5 | 30 | 40 | (ii) | ○ | ○ | △ | △ | X | X | X | 1.333 |
| Second Example 47 | 100 | 192.5 | 30 | 40 | (iii) | ○ | ○ | ○ | ○ | △ | X | X | 1.333 |
| Second Example 48 | 100 | 192.5 | 30 | 40 | (iv) | ○ | ○ | △ | X | X | X | X | 1.333 |
| Second Example 49 | 100 | 192.5 | 30 | 45 | (i) | ○ | ○ | ○ | ○ | ○ | ○ | ○ | 1.5 |
| Second Example 50 | 100 | 192.5 | 30 | 45 | (ii) | ○ | ○ | △ | △ | X | X | X | 1.5 |
| Second Example 51 | 100 | 192.5 | 30 | 45 | (iii) | ○ | ○ | ○ | ○ | △ | X | X | 1.5 |
| Second Example 52 | 100 | 192.5 | 30 | 45 | (iv) | ○ | ○ | △ | X | X | X | X | 1.5 |
| Second Example 53 | 100 | 192.5 | 30 | 50 | (i) | ○ | ○ | ○ | ○ | ○ | ○ | ○ | 1.667 |
| Second Example 54 | 100 | 192.5 | 30 | 50 | (ii) | ○ | ○ | △ | △ | X | X | X | 1.667 |
| Second Example 55 | 100 | 192.5 | 30 | 50 | (iii) | ○ | ○ | ○ | ○ | △ | X | X | 1.667 |
| Second Example 56 | 100 | 192.5 | 30 | 50 | (iv) | ○ | ○ | △ | X | X | X | X | 1.667 |
| Second Example 57 | 100 | 192.5 | 30 | 60 | (i) | ○ | ○ | ○ | ○ | ○ | ○ | X | 2 |
| Second Example 58 | 100 | 192.5 | 30 | 60 | (ii) | ○ | ○ | △ | △ | X | X | X | 2 |
| Second Example 59 | 100 | 192.5 | 30 | 60 | (iii) | ○ | ○ | ○ | ○ | △ | X | X | 2 |
| Second Example 60 | 100 | 192.5 | 30 | 60 | (iv) | ○ | ○ | △ | X | X | X | X | 2 |
| Second Example 61 | 100 | 192.5 | 30 | 65 | (i) | ○ | ○ | ○ | ○ | ○ | ○ | X | 2.167 |
| Second Example 62 | 100 | 192.5 | 30 | 65 | (ii) | ○ | ○ | △ | △ | X | X | X | 2.167 |
| Second Example 63 | 100 | 192.5 | 30 | 65 | (iii) | ○ | ○ | ○ | ○ | △ | X | X | 2.167 |
| Second Example 64 | 100 | 192.5 | 30 | 65 | (iv) | ○ | ○ | △ | X | X | X | X | 2.167 |
| Second Example 65 | 100 | 192.5 | 45 | 50 | (i) | ○ | ○ | ○ | ○ | ○ | ○ | X | 1.111 |
| Second Example 66 | 100 | 192.5 | 45 | 50 | (ii) | ○ | ○ | △ | △ | X | X | X | 1.111 |

TABLE 7

| # | thru-hole radius R(μm) | thru-hole pitch | 1st filled via bottom dia. (μm) | 2nd filled via bottom dia. (μm) | 1st filled via location | heat-cycle test results 500 | 1000 | 1250 | 1500 | 1750 | 2000 | 2500 | 2nd/1st |
|---|---|---|---|---|---|---|---|---|---|---|---|---|---|
| Second Example 67 | 100 | 192.5 | 45 | 50 | (iii) | ○ | ○ | ○ | ○ | Δ | X | X | 1.111 |
| Second Example 68 | 100 | 192.5 | 45 | 50 | (iv) | ○ | ○ | Δ | X | X | X | X | 1.111 |
| Second Example 69 | 100 | 192.5 | 45 | 60 | (i) | ○ | ○ | ○ | ○ | ○ | ○ | ○ | 1.333 |
| Second Example 70 | 100 | 192.5 | 45 | 60 | (ii) | ○ | ○ | Δ | Δ | X | X | X | 1.333 |
| Second Example 71 | 100 | 192.5 | 45 | 60 | (iii) | ○ | ○ | ○ | ○ | Δ | X | X | 1.333 |
| Second Example 72 | 100 | 192.5 | 45 | 60 | (iv) | ○ | ○ | Δ | X | X | X | X | 1.333 |
| Second Example 73 | 100 | 192.5 | 45 | 65 | (i) | ○ | ○ | ○ | ○ | ○ | ○ | ○ | 1.444 |
| Second Example 74 | 100 | 192.5 | 45 | 65 | (ii) | ○ | ○ | Δ | Δ | X | X | X | 1.444 |
| Second Example 75 | 100 | 192.5 | 45 | 65 | (iii) | ○ | ○ | ○ | ○ | Δ | X | X | 1.444 |
| Second Example 76 | 100 | 192.5 | 45 | 65 | (iv) | ○ | ○ | Δ | X | X | X | X | 1.444 |
| Second Example 77 | 100 | 192.5 | 65 | 70 | (i) | ○ | ○ | ○ | ○ | ○ | ○ | X | 1.077 |
| Second Example 78 | 100 | 192.5 | 65 | 70 | (ii) | ○ | ○ | Δ | Δ | X | X | X | 1.077 |
| Second Example 79 | 100 | 192.5 | 65 | 70 | (iii) | ○ | ○ | ○ | ○ | Δ | X | X | 1.077 |
| Second Example 80 | 100 | 192.5 | 65 | 70 | (iv) | ○ | ○ | Δ | X | X | X | X | 1.077 |
| Second Example 81 | 125 | 225 | 30 | 35 | (i) | ○ | ○ | ○ | ○ | ○ | ○ | X | 1.167 |
| Second Example 82 | 125 | 225 | 30 | 35 | (ii) | ○ | ○ | Δ | Δ | X | X | X | 1.167 |
| Second Example 83 | 125 | 225 | 30 | 35 | (iii) | ○ | ○ | ○ | ○ | Δ | X | X | 1.167 |
| Second Example 84 | 125 | 225 | 30 | 35 | (iv) | ○ | ○ | Δ | X | X | X | X | 1.167 |
| Second Example 85 | 125 | 225 | 30 | 40 | (i) | ○ | ○ | ○ | ○ | ○ | ○ | ○ | 1.333 |
| Second Example 86 | 125 | 225 | 30 | 40 | (ii) | ○ | ○ | Δ | Δ | X | X | X | 1.333 |
| Second Example 87 | 125 | 225 | 30 | 40 | (iii) | ○ | ○ | ○ | ○ | Δ | X | X | 1.333 |
| Second Example 88 | 125 | 225 | 30 | 40 | (iv) | ○ | ○ | Δ | X | X | X | X | 1.333 |
| Second Example 89 | 125 | 225 | 30 | 45 | (i) | ○ | ○ | ○ | ○ | ○ | ○ | ○ | 1.5 |
| Second Example 90 | 125 | 225 | 30 | 45 | (ii) | ○ | ○ | Δ | Δ | X | X | X | 1.5 |
| Second Example 91 | 125 | 225 | 30 | 45 | (iii) | ○ | ○ | ○ | ○ | Δ | X | X | 1.5 |
| Second Example 92 | 125 | 225 | 30 | 45 | (iv) | ○ | ○ | Δ | X | X | X | X | 1.5 |
| Second Example 93 | 125 | 225 | 30 | 50 | (i) | ○ | ○ | ○ | ○ | ○ | ○ | ○ | 1.667 |
| Second Example 94 | 125 | 225 | 30 | 50 | (ii) | ○ | ○ | Δ | Δ | X | X | X | 1.667 |
| Second Example 95 | 125 | 225 | 30 | 50 | (iii) | ○ | ○ | ○ | ○ | Δ | X | X | 1.667 |
| Second Example 96 | 125 | 225 | 30 | 50 | (iv) | ○ | ○ | Δ | X | X | X | X | 1.667 |
| Second Example 97 | 125 | 225 | 30 | 60 | (i) | ○ | ○ | ○ | ○ | ○ | ○ | X | 2 |
| Second Example 98 | 125 | 225 | 30 | 60 | (ii) | ○ | ○ | Δ | Δ | X | X | X | 2 |
| Second Example 99 | 125 | 225 | 30 | 60 | (iii) | ○ | ○ | ○ | ○ | Δ | X | X | 2 |

TABLE 8

| # | thru-hole radius R(μm) | thru-hole pitch | 1st filled via bottom dia. (μm) | 2nd filled via bottom dia. (μm) | 1st filled via location | heat-cycle test results 500 | 1000 | 1250 | 1500 | 1750 | 2000 | 2500 | 2nd/1st |
|---|---|---|---|---|---|---|---|---|---|---|---|---|---|
| Second Example 100 | 125 | 225 | 30 | 60 | (iv) | ○ | ○ | Δ | X | X | X | X | 2 |
| Second Example 101 | 125 | 225 | 30 | 65 | (i) | ○ | ○ | ○ | ○ | ○ | ○ | X | 2.167 |
| Second Example 102 | 125 | 225 | 30 | 65 | (ii) | ○ | ○ | Δ | Δ | X | X | X | 2.167 |
| Second Example 103 | 125 | 225 | 30 | 65 | (iii) | ○ | ○ | ○ | ○ | Δ | X | X | 2.167 |
| Second Example 104 | 125 | 225 | 30 | 65 | (iv) | ○ | ○ | Δ | X | X | X | X | 2.167 |
| Second Example 105 | 125 | 225 | 45 | 50 | (i) | ○ | ○ | ○ | ○ | ○ | ○ | X | 1.111 |
| Second Example 106 | 125 | 225 | 45 | 50 | (ii) | ○ | ○ | Δ | Δ | X | X | X | 1.111 |
| Second Example 107 | 125 | 225 | 45 | 50 | (iii) | ○ | ○ | ○ | ○ | Δ | X | X | 1.111 |
| Second Example 108 | 125 | 225 | 45 | 50 | (iv) | ○ | ○ | Δ | X | X | X | X | 1.111 |
| Second Example 109 | 125 | 225 | 45 | 60 | (i) | ○ | ○ | ○ | ○ | ○ | ○ | ○ | 1.333 |
| Second Example 110 | 125 | 225 | 45 | 60 | (ii) | ○ | ○ | Δ | Δ | X | X | X | 1.333 |
| Second Example 111 | 125 | 225 | 45 | 60 | (iii) | ○ | ○ | ○ | ○ | Δ | X | X | 1.333 |
| Second Example 112 | 125 | 225 | 45 | 60 | (iv) | ○ | ○ | Δ | X | X | X | X | 1.333 |
| Second Example 113 | 125 | 225 | 45 | 65 | (i) | ○ | ○ | ○ | ○ | ○ | ○ | ○ | 1.444 |
| Second Example 114 | 125 | 225 | 45 | 65 | (ii) | ○ | ○ | Δ | Δ | X | X | X | 1.444 |
| Second Example 115 | 125 | 225 | 45 | 65 | (iii) | ○ | ○ | ○ | ○ | Δ | X | X | 1.444 |
| Second Example 116 | 125 | 225 | 45 | 65 | (iv) | ○ | ○ | Δ | X | X | X | X | 1.444 |
| Second Example 117 | 125 | 225 | 32.5 | 70 | (i) | ○ | ○ | ○ | ○ | ○ | ○ | X | 2.154 |
| Second Example 118 | 125 | 225 | 32.5 | 70 | (ii) | ○ | ○ | Δ | Δ | X | X | X | 2.154 |
| Second Example 119 | 125 | 225 | 32.5 | 70 | (iii) | ○ | ○ | ○ | ○ | Δ | X | X | 2.154 |
| Second Example 120 | 125 | 225 | 32.5 | 70 | (iv) | ○ | ○ | Δ | X | X | X | X | 2.154 |
| Second Comp. Ex. 1 | 50 | 150 | 35 | 35 | (i) | Δ | X | X | X | X | X | X | 1 |
| Second Comp. Ex. 2 | 50 | 150 | 70 | 70 | (i) | Δ | X | X | X | X | X | X | 1 |
| Second Comp. Ex. 3 | 100 | 192.5 | 35 | 35 | (i) | Δ | X | X | X | X | X | X | 1 |

TABLE 8-continued

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Comp. Ex. 4 | 100 | 192.5 | 70 | 70 | (i) | Δ | X | X | X | X | X | X | 1 |
| Second Comp. Ex. 5 | 125 | 225 | 35 | 35 | (i) | ○ | Δ | X | X | X | X | X | 1 |
| Second Comp. Ex. 6 | 125 | 225 | 70 | 70 | (i) | ○ | Δ | X | X | X | X | X | 1 |

1st filled-via location:
(i) on plated cover layer and directly over through-hole (inside side-wall conductive layer)
(ii) on land (36e): see FIG. 9(G)
(iii) on plated cover layer, excluding areas directly over through-hole
(iv) on plated cover layer and on side-wall conductive layer In the tables, if electrical resistance fluctuation ratios are within ±5%, they are indicated as "good" (○), if ±5~10%, as "average" (Δ), and if over ±10, as "inferior" (X). Fluctuation ratios of the target specifications are within ±10% (namely, evaluated as "good" or "average"). Also, if fluctuation ratios are within ±10%, they are considered as "passed."

Also, corresponding to Second Examples 1-120, by filling through-holes with the same material as side-wall conductive layers, multilayered PWBs were produced to be used as Second Examples 121-240. Then, after IC chips were mounted similarly, heat cycle testing was conducted. In this case, the electrolytic copper plating condition for openings was 0.1 A/dm$^2$. The results are shown in Tables 9-12.

TABLE 9

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Example 121 | 50 | 150 | 30 | 35 | (i) | ○ | ○ | ○ | ○ | ○ | ○ | X | 1.167 |
| Second Example 122 | 50 | 150 | 30 | 35 | (ii) | ○ | ○ | Δ | Δ | X | X | X | 1.167 |
| Second Example 123 | 50 | 150 | 30 | 35 | (iii) | ○ | ○ | ○ | ○ | Δ | X | X | 1.167 |
| Second Example 124 | 50 | 150 | 30 | 35 | (iv) | ○ | ○ | Δ | X | X | X | X | 1.167 |
| Second Example 125 | 50 | 150 | 30 | 40 | (i) | ○ | ○ | ○ | ○ | ○ | ○ | ○ | 1.333 |
| Second Example 126 | 50 | 150 | 30 | 40 | (ii) | ○ | ○ | Δ | Δ | X | X | X | 1.333 |
| Second Example 127 | 50 | 150 | 30 | 40 | (iii) | ○ | ○ | ○ | ○ | Δ | X | X | 1.333 |
| Second Example 128 | 50 | 150 | 30 | 40 | (iv) | ○ | ○ | Δ | X | X | X | X | 1.333 |
| Second Example 129 | 50 | 150 | 30 | 45 | (i) | ○ | ○ | ○ | ○ | ○ | ○ | ○ | 1.5 |
| Second Example 130 | 50 | 150 | 30 | 45 | (ii) | ○ | ○ | Δ | Δ | X | X | X | 1.5 |
| Second Example 131 | 50 | 150 | 30 | 45 | (iii) | ○ | ○ | ○ | ○ | Δ | X | X | 1.5 |
| Second Example 132 | 50 | 150 | 30 | 45 | (iv) | ○ | ○ | Δ | X | X | X | X | 1.5 |
| Second Example 133 | 50 | 150 | 30 | 50 | (i) | ○ | ○ | ○ | ○ | ○ | ○ | ○ | 1.667 |
| Second Example 134 | 50 | 150 | 30 | 50 | (ii) | ○ | ○ | Δ | Δ | X | X | X | 1.667 |
| Second Example 135 | 50 | 150 | 30 | 50 | (iii) | ○ | ○ | ○ | ○ | Δ | X | X | 1.667 |
| Second Example 136 | 50 | 150 | 30 | 50 | (iv) | ○ | ○ | Δ | X | X | X | X | 1.667 |
| Second Example 137 | 50 | 150 | 30 | 60 | (i) | ○ | ○ | ○ | ○ | ○ | ○ | X | 2 |
| Second Example 138 | 50 | 150 | 30 | 60 | (ii) | ○ | ○ | Δ | Δ | X | X | X | 2 |
| Second Example 139 | 50 | 150 | 30 | 60 | (iii) | ○ | ○ | ○ | ○ | Δ | X | X | 2 |
| Second Example 140 | 50 | 150 | 30 | 60 | (iv) | ○ | ○ | Δ | X | X | X | X | 2 |
| Second Example 141 | 50 | 150 | 30 | 65 | (i) | ○ | ○ | ○ | ○ | ○ | ○ | X | 2.167 |
| Second Example 142 | 50 | 150 | 30 | 65 | (ii) | ○ | ○ | Δ | Δ | X | X | X | 2.167 |
| Second Example 143 | 50 | 150 | 30 | 65 | (iii) | ○ | ○ | ○ | ○ | Δ | X | X | 2.167 |
| Second Example 144 | 50 | 150 | 30 | 65 | (iv) | ○ | ○ | Δ | X | X | X | X | 2.167 |
| Second Example 145 | 50 | 150 | 45 | 50 | (i) | ○ | ○ | ○ | ○ | ○ | ○ | X | 1.111 |
| Second Example 146 | 50 | 150 | 45 | 50 | (ii) | ○ | ○ | Δ | Δ | X | X | X | 1.111 |
| Second Example 147 | 50 | 150 | 45 | 50 | (iii) | ○ | ○ | ○ | ○ | Δ | X | X | 1.111 |
| Second Example 148 | 50 | 150 | 45 | 50 | (iv) | ○ | ○ | Δ | X | X | X | X | 1.111 |
| Second Example 149 | 50 | 150 | 45 | 60 | (i) | ○ | ○ | ○ | ○ | ○ | ○ | ○ | 1.333 |
| Second Example 150 | 50 | 150 | 45 | 60 | (ii) | ○ | ○ | Δ | Δ | X | X | X | 1.333 |
| Second Example 151 | 50 | 150 | 45 | 60 | (iii) | ○ | ○ | ○ | ○ | Δ | X | X | 1.333 |
| Second Example 152 | 50 | 150 | 45 | 60 | (iv) | ○ | ○ | Δ | X | X | X | X | 1.333 |
| Second Example 153 | 50 | 150 | 45 | 65 | (i) | ○ | ○ | ○ | ○ | ○ | ○ | ○ | 1.444 |

TABLE 10

| # | thru-hole radius R(μm) | thru-hole pitch | 1st filled via bottom dia. (μm) | 2nd filled via bottom dia. (μm) | 1st filled via location | heat-cycle test results 500 | 1000 | 1250 | 1500 | 1750 | 2000 | 2500 | 2nd/1st |
|---|---|---|---|---|---|---|---|---|---|---|---|---|---|
| Second Example 154 | 50 | 150 | 45 | 65 | (ii) | ○ | ○ | △ | △ | X | X | X | 1.444 |
| Second Example 155 | 50 | 150 | 45 | 65 | (iii) | ○ | ○ | ○ | ○ | △ | X | X | 1.444 |
| Second Example 156 | 50 | 150 | 45 | 65 | (iv) | ○ | ○ | △ | X | X | X | X | 1.444 |
| Second Example 157 | 50 | 150 | 65 | 70 | (i) | ○ | ○ | ○ | ○ | ○ | ○ | X | 1.077 |
| Second Example 158 | 50 | 150 | 65 | 70 | (ii) | ○ | ○ | △ | △ | X | X | X | 1.077 |
| Second Example 159 | 50 | 150 | 65 | 70 | (iii) | ○ | ○ | ○ | ○ | △ | X | X | 1.077 |
| Second Example 160 | 50 | 150 | 65 | 70 | (iv) | ○ | ○ | △ | X | X | X | X | 1.077 |
| Second Example 161 | 100 | 192.5 | 30 | 35 | (i) | ○ | ○ | ○ | ○ | ○ | ○ | X | 1.167 |
| Second Example 162 | 100 | 192.5 | 30 | 35 | (ii) | ○ | ○ | △ | △ | X | X | X | 1.167 |
| Second Example 163 | 100 | 192.5 | 30 | 35 | (iii) | ○ | ○ | ○ | ○ | △ | X | X | 1.167 |
| Second Example 164 | 100 | 192.5 | 30 | 35 | (iv) | ○ | ○ | △ | X | X | X | X | 1.167 |
| Second Example 165 | 100 | 192.5 | 30 | 40 | (i) | ○ | ○ | ○ | ○ | ○ | ○ | ○ | 1.333 |
| Second Example 166 | 100 | 192.5 | 30 | 40 | (ii) | ○ | ○ | △ | △ | X | X | X | 1.333 |
| Second Example 167 | 100 | 192.5 | 30 | 40 | (iii) | ○ | ○ | ○ | ○ | △ | X | X | 1.333 |
| Second Example 168 | 100 | 192.5 | 30 | 40 | (iv) | ○ | ○ | △ | X | X | X | X | 1.333 |
| Second Example 169 | 100 | 192.5 | 30 | 45 | (i) | ○ | ○ | ○ | ○ | ○ | ○ | ○ | 1.5 |
| Second Example 170 | 100 | 192.5 | 30 | 45 | (ii) | ○ | ○ | △ | △ | X | X | X | 1.5 |
| Second Example 171 | 100 | 192.5 | 30 | 45 | (iii) | ○ | ○ | ○ | ○ | △ | X | X | 1.5 |
| Second Example 172 | 100 | 192.5 | 30 | 45 | (iv) | ○ | ○ | △ | X | X | X | X | 1.5 |
| Second Example 173 | 100 | 192.5 | 30 | 50 | (i) | ○ | ○ | ○ | ○ | ○ | ○ | ○ | 1.667 |
| Second Example 174 | 100 | 192.5 | 30 | 50 | (ii) | ○ | ○ | △ | △ | X | X | X | 1.667 |
| Second Example 175 | 100 | 192.5 | 30 | 50 | (iii) | ○ | ○ | ○ | ○ | △ | X | X | 1.667 |
| Second Example 176 | 100 | 192.5 | 30 | 50 | (iv) | ○ | ○ | △ | X | X | X | X | 1.667 |
| Second Example 177 | 100 | 192.5 | 30 | 60 | (i) | ○ | ○ | ○ | ○ | ○ | ○ | X | 2 |
| Second Example 178 | 100 | 192.5 | 30 | 60 | (ii) | ○ | ○ | △ | △ | X | X | X | 2 |
| Second Example 179 | 100 | 192.5 | 30 | 60 | (iii) | ○ | ○ | ○ | ○ | △ | X | X | 2 |
| Second Example 180 | 100 | 192.5 | 30 | 60 | (iv) | ○ | ○ | △ | X | X | X | X | 2 |
| Second Example 181 | 100 | 192.5 | 30 | 65 | (i) | ○ | ○ | ○ | ○ | ○ | ○ | X | 2.167 |
| Second Example 182 | 100 | 192.5 | 30 | 65 | (ii) | ○ | ○ | △ | △ | X | X | X | 2.167 |
| Second Example 183 | 100 | 192.5 | 30 | 65 | (iii) | ○ | ○ | ○ | ○ | △ | X | X | 2.167 |
| Second Example 184 | 100 | 192.5 | 30 | 65 | (iv) | ○ | ○ | △ | X | X | X | X | 2.167 |
| Second Example 185 | 100 | 192.5 | 45 | 50 | (i) | ○ | ○ | ○ | ○ | ○ | ○ | X | 1.111 |
| Second Example 186 | 100 | 192.5 | 45 | 50 | (ii) | ○ | ○ | △ | △ | X | X | X | 1.111 |

TABLE 11

| # | thru-hole radius R(μm) | thru-hole pitch | 1st filled via bottom dia. (μm) | 2nd filled via bottom dia. (μm) | 1st filled via location | heat-cycle test results 500 | 1000 | 1250 | 1500 | 1750 | 2000 | 2500 | 2nd/1st |
|---|---|---|---|---|---|---|---|---|---|---|---|---|---|
| Second Example 187 | 100 | 192.5 | 45 | 50 | (iii) | ○ | ○ | ○ | ○ | △ | X | X | 1.111 |
| Second Example 188 | 100 | 192.5 | 45 | 50 | (iv) | ○ | ○ | △ | X | X | X | X | 1.111 |
| Second Example 189 | 100 | 192.5 | 45 | 60 | (i) | ○ | ○ | ○ | ○ | ○ | ○ | ○ | 1.333 |
| Second Example 190 | 100 | 192.5 | 45 | 60 | (ii) | ○ | ○ | △ | △ | X | X | X | 1.333 |
| Second Example 191 | 100 | 192.5 | 45 | 60 | (iii) | ○ | ○ | ○ | ○ | △ | X | X | 1.333 |
| Second Example 192 | 100 | 192.5 | 45 | 60 | (iv) | ○ | ○ | △ | X | X | X | X | 1.333 |
| Second Example 193 | 100 | 192.5 | 45 | 65 | (i) | ○ | ○ | ○ | ○ | ○ | ○ | ○ | 1.444 |
| Second Example 194 | 100 | 192.5 | 45 | 65 | (ii) | ○ | ○ | △ | △ | X | X | X | 1.444 |
| Second Example 195 | 100 | 192.5 | 45 | 65 | (iii) | ○ | ○ | ○ | ○ | △ | X | X | 1.444 |
| Second Example 196 | 100 | 192.5 | 45 | 65 | (iv) | ○ | ○ | △ | X | X | X | X | 1.444 |
| Second Example 197 | 100 | 192.5 | 65 | 70 | (i) | ○ | ○ | ○ | ○ | ○ | ○ | X | 1.077 |
| Second Example 198 | 100 | 192.5 | 65 | 70 | (ii) | ○ | ○ | △ | △ | X | X | X | 1.077 |
| Second Example 199 | 100 | 192.5 | 65 | 70 | (iii) | ○ | ○ | ○ | ○ | △ | X | X | 1.077 |
| Second Example 200 | 100 | 192.5 | 65 | 70 | (iv) | ○ | ○ | △ | X | X | X | X | 1.077 |
| Second Example 201 | 125 | 225 | 30 | 35 | (i) | ○ | ○ | ○ | ○ | ○ | ○ | X | 1.167 |
| Second Example 202 | 125 | 225 | 30 | 35 | (ii) | ○ | ○ | △ | △ | X | X | X | 1.167 |
| Second Example 203 | 125 | 225 | 30 | 35 | (iii) | ○ | ○ | ○ | ○ | △ | X | X | 1.167 |
| Second Example 204 | 125 | 225 | 30 | 35 | (iv) | ○ | ○ | △ | X | X | X | X | 1.167 |
| Second Example 205 | 125 | 225 | 30 | 40 | (i) | ○ | ○ | ○ | ○ | ○ | ○ | ○ | 1.333 |
| Second Example 206 | 125 | 225 | 30 | 40 | (ii) | ○ | ○ | △ | △ | X | X | X | 1.333 |
| Second Example 207 | 125 | 225 | 30 | 40 | (iii) | ○ | ○ | ○ | ○ | △ | X | X | 1.333 |
| Second Example 208 | 125 | 225 | 30 | 40 | (iv) | ○ | ○ | △ | X | X | X | X | 1.333 |
| Second Example 209 | 125 | 225 | 30 | 45 | (i) | ○ | ○ | ○ | ○ | ○ | ○ | ○ | 1.5 |
| Second Example 210 | 125 | 225 | 30 | 45 | (ii) | ○ | ○ | △ | △ | X | X | X | 1.5 |
| Second Example 211 | 125 | 225 | 30 | 45 | (iii) | ○ | ○ | ○ | ○ | △ | X | X | 1.5 |
| Second Example 212 | 125 | 225 | 30 | 45 | (iv) | ○ | ○ | △ | X | X | X | X | 1.5 |
| Second Example 213 | 125 | 225 | 30 | 50 | (i) | ○ | ○ | ○ | ○ | ○ | ○ | ○ | 1.667 |
| Second Example 214 | 125 | 225 | 30 | 50 | (ii) | ○ | ○ | △ | △ | X | X | X | 1.667 |
| Second Example 215 | 125 | 225 | 30 | 50 | (iii) | ○ | ○ | ○ | ○ | △ | X | X | 1.667 |
| Second Example 216 | 125 | 225 | 30 | 50 | (iv) | ○ | ○ | △ | X | X | X | X | 1.667 |
| Second Example 217 | 125 | 225 | 30 | 60 | (i) | ○ | ○ | ○ | ○ | ○ | ○ | X | 2 |

TABLE 11-continued

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Example 218 | 125 | 225 | 30 | 60 | (ii) | ○ | ○ | Δ | Δ | X | X | X | 2 |
| Second Example 219 | 125 | 225 | 30 | 60 | (iii) | ○ | ○ | ○ | ○ | Δ | X | X | 2 |

TABLE 12

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Second Example 220 | 125 | 225 | 30 | 60 | (iv) | ○ | ○ | Δ | X | X | X | X | 2 |
| Second Example 221 | 125 | 225 | 30 | 65 | (i) | ○ | ○ | ○ | ○ | ○ | ○ | X | 2.167 |
| Second Example 222 | 125 | 225 | 30 | 65 | (ii) | ○ | ○ | Δ | Δ | X | X | X | 2.167 |
| Second Example 223 | 125 | 225 | 30 | 65 | (iii) | ○ | ○ | ○ | ○ | Δ | X | X | 2.167 |
| Second Example 224 | 125 | 225 | 30 | 65 | (iv) | ○ | ○ | Δ | X | X | X | X | 2.167 |
| Second Example 225 | 125 | 225 | 45 | 50 | (i) | ○ | ○ | ○ | ○ | ○ | ○ | X | 1.111 |
| Second Example 226 | 125 | 225 | 45 | 50 | (ii) | ○ | ○ | Δ | Δ | X | X | X | 1.111 |
| Second Example 227 | 125 | 225 | 45 | 50 | (iii) | ○ | ○ | ○ | ○ | Δ | X | X | 1.111 |
| Second Example 228 | 125 | 225 | 45 | 50 | (iv) | ○ | ○ | Δ | X | X | X | X | 1.111 |
| Second Example 229 | 125 | 225 | 45 | 60 | (i) | ○ | ○ | ○ | ○ | ○ | ○ | ○ | 1.333 |
| Second Example 230 | 125 | 225 | 45 | 60 | (ii) | ○ | ○ | Δ | Δ | X | X | X | 1.333 |
| Second Example 231 | 125 | 225 | 45 | 60 | (iii) | ○ | ○ | ○ | ○ | Δ | X | X | 1.333 |
| Second Example 232 | 125 | 225 | 45 | 60 | (iv) | ○ | ○ | Δ | X | X | X | X | 1.333 |
| Second Example 233 | 125 | 225 | 45 | 65 | (i) | ○ | ○ | ○ | ○ | ○ | ○ | ○ | 1.444 |
| Second Example 234 | 125 | 225 | 45 | 65 | (ii) | ○ | ○ | Δ | Δ | X | X | X | 1.444 |
| Second Example 235 | 125 | 225 | 45 | 65 | (iii) | ○ | ○ | ○ | ○ | Δ | X | X | 1.444 |
| Second Example 236 | 125 | 225 | 45 | 65 | (iv) | ○ | ○ | Δ | X | X | X | X | 1.444 |
| Second Example 237 | 125 | 225 | 65 | 70 | (i) | ○ | ○ | ○ | ○ | ○ | ○ | X | 1.077 |
| Second Example 238 | 125 | 225 | 65 | 70 | (ii) | ○ | ○ | Δ | Δ | X | X | X | 1.077 |
| Second Example 239 | 125 | 225 | 65 | 70 | (iii) | ○ | ○ | ○ | ○ | Δ | X | X | 1.077 |
| Second Example 240 | 125 | 225 | 65 | 70 | (iv) | ○ | ○ | Δ | X | X | X | X | 1.077 |

1st filled-via locations:
(i) on plated cover layer and directly over through-hole (inside side-wall conductive layer)
(ii) on land (36e): see FIG. 9(G)
(iii) on plated cover layer, excluding areas directly over through-hole
(iv) on plated cover layer and on side-wall conductive layer Furthermore, in Second Examples 3, 7, 11 . . . , 115, 119 (among Second Examples 1-120, examples where the land configuration of the first filled via is set as type (iii): on the plated cover layer, excluding the area directly over the through-hole opening), land configurations of first filled vias at the through-holes located directly under the IC chip are set as type (i) to make Third Examples 1-30. In the Third Examples 1-30, after IC chips were mounted, heat cycle testing was conducted. For the evaluation, certain circuits including both (i) and (iii) are measured to obtain connection resistance values. Parameters such as the bottom diameter or the like of filled vias in Third Examples 1-30 and evaluation results are shown in Table 13.

TABLE 13

| # | thru-hole radius R(μm) | thru-hole pitch | 1st filled via bottom dia. (μm) | 2nd filled via bottom dia. (μm) | 1st filled via location | heat-cycle test results | | | | | | | 2nd/1st |
|---|---|---|---|---|---|---|---|---|---|---|---|---|---|
| | | | | | | 500 | 1000 | 1250 | 1500 | 1750 | 2000 | 2500 | |
| Third Example 1 | 50 | 150 | 30 | 35 | directly under IC: (i), other regions: (iii) | ○ | ○ | ○ | ○ | ○ | ○ | X | 1.167 |
| Third Example 2 | 50 | 150 | 30 | 40 | directly under IC: (i), other regions: (iii) | ○ | ○ | ○ | ○ | ○ | ○ | ○ | 1.333 |
| Third Example 3 | 50 | 150 | 30 | 45 | directly under IC: (i), other regions: (iii) | ○ | ○ | ○ | ○ | ○ | ○ | ○ | 1.5 |
| Third Example 4 | 50 | 150 | 30 | 50 | directly under IC: (i), other regions: (iii) | ○ | ○ | ○ | ○ | ○ | ○ | ○ | 1.667 |
| Third Example 5 | 50 | 150 | 30 | 60 | directly under IC: (i), other regions: (iii) | ○ | ○ | ○ | ○ | ○ | ○ | X | 2 |
| Third Example 6 | 50 | 150 | 30 | 65 | directly under IC: (i), other regions: (iii) | ○ | ○ | ○ | ○ | ○ | ○ | X | 2.167 |
| Third Example 7 | 50 | 150 | 45 | 50 | directly under IC: (i), other regions: (iii) | ○ | ○ | ○ | ○ | ○ | ○ | X | 1.111 |
| Third Example 8 | 50 | 150 | 45 | 60 | directly under IC: (i), other regions: (iii) | ○ | ○ | ○ | ○ | ○ | ○ | ○ | 1.333 |
| Third Example 9 | 50 | 150 | 45 | 65 | directly under IC: (i), other regions: (iii) | ○ | ○ | ○ | ○ | ○ | ○ | ○ | 1.444 |
| Third Example 10 | 50 | 150 | 65 | 70 | directly under IC: (i), other regions: (iii) | ○ | ○ | ○ | ○ | ○ | ○ | X | 1.077 |
| Third Example 11 | 100 | 192.5 | 30 | 35 | directly under IC: (i), other regions: (iii) | ○ | ○ | ○ | ○ | ○ | ○ | X | 1.167 |
| Third Example 12 | 100 | 192.5 | 30 | 40 | directly under IC: (i), other regions: (iii) | ○ | ○ | ○ | ○ | ○ | ○ | ○ | 1.333 |
| Third Example 13 | 100 | 192.5 | 30 | 45 | directly under IC: (i), other regions: (iii) | ○ | ○ | ○ | ○ | ○ | ○ | ○ | 1.5 |

TABLE 13-continued

| # | thru-hole radius R(μm) | thru-hole pitch | 1st filled via bottom dia. (μm) | 2nd filled via bottom dia. (μm) | 1st filled via location | heat-cycle test results 500 | 1000 | 1250 | 1500 | 1750 | 2000 | 2500 | 2nd/1st |
|---|---|---|---|---|---|---|---|---|---|---|---|---|---|
| Third Example 14 | 100 | 192.5 | 30 | 50 | directly under IC: (i), other regions: (iii) | ○ | ○ | ○ | ○ | ○ | ○ | ○ | 1.667 |
| Third Example 15 | 100 | 192.5 | 30 | 60 | directly under IC: (i), other regions: (iii) | ○ | ○ | ○ | ○ | ○ | ○ | X | 2 |
| Third Example 16 | 100 | 192.5 | 30 | 65 | directly under IC: (i), other regions: (iii) | ○ | ○ | ○ | ○ | ○ | ○ | X | 2.167 |
| Third Example 17 | 100 | 192.5 | 45 | 50 | directly under IC: (i), other regions: (iii) | ○ | ○ | ○ | ○ | ○ | ○ | X | 1.111 |
| Third Example 18 | 100 | 192.5 | 45 | 60 | directly under IC: (i), other regions: (iii) | ○ | ○ | ○ | ○ | ○ | ○ | ○ | 1.333 |
| Third Example 19 | 100 | 192.5 | 45 | 65 | directly under IC: (i), other regions: (iii) | ○ | ○ | ○ | ○ | ○ | ○ | ○ | 1.444 |
| Third Example 20 | 100 | 192.5 | 65 | 70 | directly under IC: (i), other regions: (iii) | ○ | ○ | ○ | ○ | ○ | ○ | X | 1.077 |
| Third Example 21 | 125 | 225 | 30 | 35 | directly under IC: (i), other regions: (iii) | ○ | ○ | ○ | ○ | ○ | ○ | X | 1.167 |
| Third Example 22 | 125 | 225 | 30 | 40 | directly under IC: (i), other regions: (iii) | ○ | ○ | ○ | ○ | ○ | ○ | ○ | 1.333 |
| Third Example 23 | 125 | 225 | 30 | 45 | directly under IC: (i), other regions: (iii) | ○ | ○ | ○ | ○ | ○ | ○ | ○ | 1.5 |
| Third Example 24 | 125 | 225 | 30 | 50 | directly under IC: (i), other regions: (iii) | ○ | ○ | ○ | ○ | ○ | ○ | ○ | 1.667 |
| Third Example 25 | 125 | 225 | 30 | 60 | directly under IC: (i), other regions: (iii) | ○ | ○ | ○ | ○ | ○ | ○ | X | 2 |
| Third Example 26 | 125 | 225 | 30 | 65 | directly under IC: (i), other regions: (iii) | ○ | ○ | ○ | ○ | ○ | ○ | X | 2.167 |
| Third Example 27 | 125 | 225 | 45 | 50 | directly under IC: (i), other regions: (iii) | ○ | ○ | ○ | ○ | ○ | ○ | X | 1.111 |
| Third Example 28 | 125 | 225 | 45 | 60 | directly under IC: (i), other regions: (iii) | ○ | ○ | ○ | ○ | ○ | ○ | ○ | 1.333 |
| Third Example 29 | 125 | 225 | 45 | 65 | directly under IC: (i), other regions: (iii) | ○ | ○ | ○ | ○ | ○ | ○ | ○ | 1.444 |
| Third Example 30 | 125 | 225 | 32.5 | 70 | directly under IC: (i), other regions: (iii) | ○ | ○ | ○ | ○ | ○ | ○ | X | 2.154 |

1st filled-via location:
(i) on plated cover layer and directly over through-hole (inside side-wall conductive layer)
(iii) on plated cover layer, excluding areas directly over through-hole According to the evaluation results, Second Examples 1-120, where first filled-via bottom diameters are made smaller than the second filled-via bottom diameters, at least cleared the target specifications and passed after repeating heat cycle testing 1,250 times. By comparison, Second Comparative Examples 1-6, where the first filled-via bottom diameters are made the same as or larger than the second filled-via bottom diameters, showed the results of "average" or "inferior" in the target specifications, and after repeating the cycle 1,250 times, the results were all "inferior." In Second Comparative Examples 1-6, since the first filled-via bottom diameters are made the same as or larger than the second filled-via bottom diameters, adhesiveness between the first filled vias and the land portions of the first filled vias is strong. Accordingly, the first filled vias and the surrounding resin insulation layers or the like seldom transform to relieve stresses. Thus, it is presumed that stresses from heating and cooling concentrate on the first filled-via surfaces and the second filled-via bottoms, and adhesiveness between the second filled-via bottom and the first filled-via surface is weakened, resulting in increased connection resistance.

Also, a comparison between Second Comparative Examples 1-4 and Second Comparative Examples 5 and 6 showed the following: When the first filled-via bottom diameters were made the same as or larger than the second filled-via bottom diameters, but radiuses of through-hole openings and their pitches were formed in low density, the target specification was satisfied; whereas through-hole radiuses were 100 μm or smaller, and their pitch was 385 μm or less, the results were inferior after testing 1,000 times. It is presumed that different results came from the larger stresses generated in the latter case. As for the reasons, referring to Second Comparative Examples 5-6, in insulation substrate 30, through-hole conductors (copper: 16 ppm), whose thermal expansion rate is significantly different from that of the insulation substrate (thermal expansion rate: 50-60 ppm), are densely formed. Thus, it is presumed that multilayered PWBs may transform significantly. Therefore, it is found that employing the foregoing embodiments according to the present invention in multilayered PWBs where through-hole radiuses are 100 μm or smaller and their pitches are 385 μm or less is significant.

From the results of Second Examples 1-120 after repeating 1,500, 1,750, 2,000 cycles, even if the first filled-via bottom diameters are made smaller than the second filled-via bottom diameters, tolerance to heat cycles differs depending on land configurations of first filled vias. Long-term reliability is excellent in (iv), then decreases from (ii) to (iii) to (i) in that order. In insulation substrate 30, through-holes having different physical properties such as Young's modulus ratio, Poisson's ratio, thermal expansion coefficient or the like are formed. Thus, it is presumed that depending on the land configuration of the first filled via, the position of the first filled via, existence of wiring between land and through-hole and the like, stresses built up between the second filled-via bottom portion and first filled-via surface may fluctuate. Since through-holes and insulation substrates have different physical properties, insulation substrates and through-holes transform differently. In case (iv), the first filled-via bottom portion is positioned over both, thus the second filled via transforms more than in cases (i)-(iii). By comparison, in cases (i)-(iii), since the first filled via is positioned over the through-hole or the insulation substrate, it is presumed that tolerance to heat cycles is excellent. The reason that case (iii) shows worse results than case (i) is presumed to be as follows: In the inner walls of through-holes, as a through-hole side-wall conductor, hard-to-transform copper (Young's modulus ratio and thermal expansion ratio are small relative to the insulation substrate) is formed. Accordingly, the inner portion of the through-hole transforms less than the insulation substrate base. Also, effects from roughened surfaces (36α) on the inner walls (see FIG. 1(D)) may be a factor as well. Therefore, stresses between the second filled-via bottom portions and first filled-via surfaces are decreased. In addition, compared with case (ii), in case (iii) the first filled-via land is positioned near the through-hole. Thus, it is presumed that the first filled via transforms less, affected by the through-hole side-wall conductor.

Moreover, from the results after testing 2,500 times, it is found that the value obtained by dividing the second filled-via bottom diameter by the first filled-via bottom diameter is preferably in the range of 1.3-1.7. Within such a range, even if the adhesive power (adhesiveness per unit area×adhered area) between the first filled-via land (lid-shaped conductive layers in cases (i), (iii) and (iv)) and the first filled-via bottom portion is lower than the adhesive power between the second filled-via bottom portion and the first filled-via surface, the adhesive power/stress is presumed to be almost equivalent due to the different stresses between the two (if there is difference between the two, the stresses will be concentrated on the weaker one, and problems such as peeling will tend to occur).

Moreover, the results of Second Examples 121-240 are equivalent to those of Second Examples 1-120. When comparing results of Third Examples 1-30 and Second Examples 1, 5, . . . , 113, 117 (among Second Examples 1-120, examples whose first filled-via lands are (i)), the results are equivalent. Therefore, it is found that at least the first filled vias positioned directly under the IC should be formed directly over the through-holes and their bottom diameters should be made smaller than second filled-via bottom diameters. Presumably, this is because stresses are large directly under the IC due to the thermal expansion coefficient difference between the IC and the insulation substrate.

If a stacked-via structure is employed to shorten wiring length, via-hole reliability tends to be lowered and it is difficult to decrease via-hole diameters. Generally, when the via-hole bottom diameter is decreased, the contact area between the conductors formed in via holes and the lower-layer conductors (lands) decreases. Accordingly, the adhesiveness between the via holes and the lands is lowered, and when heat-cycle testing or the like is conducted, it has been observed that connection resistances between the two tend to increase.

In a built-up PWB, via holes are formed by forming electrolytic plated films after electroless plated films have been formed. Since the first-formed electroless plated films contain organic matter, hydrogen molecules, hydrogen atoms and the like, and thus are fragile, presumably cracks tend to occur at the electroless plated films. Also, since electroless plated films are low in ductility, it is presumed that if a PWB is warped when IC chips or the like are mounted, electroless plated films cannot follow the warping and can be easily separated from the lands.

It has been found that via-hole reliability tends to decrease in certain sections of a multilayered PWB. From simulation testing, it has been found that on the bottom of the filled vias in the second interlaminar insulation layers (hereinafter "second filled vias"), which are formed directly over the filled vias (hereinafter "first filled vias") in the first interlaminar insulation layers, more stresses build up at heat-cycle testing than on the bottom of the first filled vias.

According to the foregoing embodiments of the present invention, the bottom diameter of a filled via in the first interlaminar insulation layer is made smaller than the bottom diameter of a filled via formed over the first filled-via in the second interlaminar insulation layers. By doing so, while using via holes having small diameters and raising the integration scale, the connection reliability of the stacked-via is kept from being reduced. As shown in FIG. 15(A), if concave depth (the depth of the hollowed portion measured from the top surface) (P1) is 7 μm or less, and as shown in FIG. 15(B), if convex height (the height of the protruding portion measured from the top level surface) (P2) is 7 μm or less, such are defined as filled vias.

Furthermore, first filled vias may be formed on lid-shaped conductive layers (plated cover layers). When formed on lid-shaped conductive layers, through-holes and the insulation substrate making up the core differ in their physical properties and thus lid-shaped conductive layers disfigure in an extremely complex way. If a stacked-via structure is made on such lid-shaped conductive layers, in the higher layers the degree of disfigurement is larger. Accordingly, larger stresses tend to build up on the bottom portions of second filled vias.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A multilayered printed wiring board comprising:
a core substrate having a through hole opening with a radius R;
a through hole structure formed at the through hole opening and comprising an electroless plated film and an electrolytic plated film formed on the electroless plated film, the through hole structure having a lid-shaped conductive structure being formed over the core substrate at an end portion of the through-hole opening and covering the end portion of the through-hole opening;
a first interlaminar resin insulation layer formed over the core substrate and having a first via hole structure with a bottom radius r, the first via hole structure being formed on the lid-shaped conductive structure and comprising a filled via which comprises an electroless plated film and an electrolytic plated material filling to close an opening formed by the electroless plated film in the first interlaminar resin insulation layer; and
a second interlaminar resin insulation layer formed over the first interlaminar resin insulation layer and having a second via hole structure, the second via hole structure comprising an electroless plated film and an electrolytic plated material,
wherein the first via hole structure has a gravity center at or beyond a radius D, where D=(R−r/3) and the radius D is measured from a gravity center of the through-hole opening, the bottom radius r of the first via hole structure is larger than a bottom radius of the second via hole structure, the lid-shaped conductive structure comprises a first conductive portion covering the end portion of through-hole opening and a second conductive portion protruding from the first conductive portion, and the first via hole structure is formed on the second conductive portion of the lid-shaped conductive structure.

2. The multilayered printed wiring board according to claim 1, further comprising a solder resist layer formed over the second interlaminar resin insulation layer.

3. The multilayered printed wiring board according to claim 2, further comprising a plurality of solder bumps positioned to connect a IC chip, wherein the solder bumps are formed in openings of the solder resist layer.

4. The multilayered printed wiring board according to claim 1, wherein the through hole structure comprises at least one side wall conductive layer formed in the through hole opening, and the lid-shaped conductive structure is formed over an end portion of the side wall conductive layer.

5. The multilayered printed wiring board according to claim 4, wherein the through hole structure comprises at least one of a conductive material and resin filler.

6. The multilayered printed wiring board according to claim 4, wherein the through hole structure comprises at least one of copper and resin filler.

7. The multilayered printed wiring board according to claim 1, further comprising a solder resist layer formed directly on the second interlaminar resin insulation layer.

8. The multilayered printed wiring board according to claim 7, further comprising a plurality of solder bumps configured to be electrically connected to a daughter board, wherein the solder bumps are formed in openings of the solder resist layer.

9. The multilayered printed wiring board according to claim 1, wherein the bottom radius of the first via hole structure and the bottom radius of the second via hole structure has a ratio obtained by dividing the bottom radius of the first via hole structure by the bottom radius of the second via hole structure in a range of 1.3 to 1.7.

10. The multilayered printed wiring board according to claim 1, wherein the first conductive portion of the lid-shaped conductive structure has a rectangular portion, and the second conductive portion of the lid-shaped conductive structure has a rounded protruding portion.

11. The multilayered printed wiring board according to claim 1, wherein the lid-shaped conductive structure has a shape of two partial circles adjoined to each other.

12. The multilayered printed wiring board according to claim 1, wherein the lid-shaped conductive structure has a protruding portion only where the first via hole structure is formed, and the protruding portion is the second conductive portion.

13. A multilayered printed wiring board comprising:
a core substrate having a through hole opening;
a through hole structure formed at the through hole opening and comprising an electroless plated film and an electrolytic plated film formed on the electroless plated film, the through hole structure having a lid-shaped conductive structure being formed over the core substrate at an end portion of the through-hole opening and covering the end portion of the through-hole opening;
a first interlaminar resin insulation layer formed over the core substrate and having a first filled via structure, the first filled via structure being formed on the lid-shaped conductive structure and comprising a filled via which comprises an electroless plated film and an electrolytic plated material filling to close an opening formed by the electroless plated film in the first interlaminar resin insulation layer; and
a second interlaminar resin insulation layer formed over the first interlaminar resin insulation layer and having a second filled via structure, the second filled via structure comprising an electroless plated film and an electrolytic plated material, the second interlaminar resin insulation layer being formed directly over the first filled via structure,
wherein the first filled via structure has a bottom diameter which is smaller than a bottom diameter of the second filled via structure, the lid-shaped conductive structure comprises a first conductive portion covering the end portion of through-hole opening and a second conductive portion protruding from the first conductive portion, and the first filled via structure is formed on the second conductive portion of the lid-shaped conductive structure.

14. The multilayered printed wiring board according to claim 13, wherein the first filled via structure is formed on the lid-shaped conductive layer.

15. The multilayered printed wiring board according to claim 13, further comprising a solder resist layer formed over the second interlaminar resin insulation layer.

16. The multilayered printed wiring board according to claim 15, further comprising a plurality of solder bumps positioned to connect a IC chip, wherein the solder bumps are formed in openings of the solder resist layer.

17. The multilayered printed wiring board according to claim 13, wherein the through hole structure comprises at least one side wall conductive layer formed in the through hole opening, and the lid-shaped conductive structure is formed over an end portion of the side wall conductive layer.

18. The multilayered printed wiring board according to claim 17, wherein the through hole structure comprises at least one of a conductive material and resin filler.

19. The multilayered printed wiring board according to claim 17, wherein the through hole structure comprises at least one of copper and resin filler.

20. The multilayered printed wiring board according to claim 13, further comprising a solder resist layer formed directly on the second interlaminar resin insulation layer.

21. The multilayered printed wiring board according to claim 20, further comprising a plurality of solder bumps configured to be electrically connected to a daughter board, wherein the solder bumps are formed in openings of the solder resist layer.

22. The multilayered printed wiring board according to claim 13, wherein a bottom radius of the first via hole structure and a bottom radius of the second via hole structure has a ratio obtained by dividing the bottom radius of the second via hole structure by the bottom radius of the first via hole structure in a range of 1.3 to 1.7.

23. The multilayered printed wiring board according to claim 13, wherein the first conductive portion of the lid-shaped conductive structure has a rectangular portion, and the second conductive portion of the lid-shaped conductive structure has a rounded protruding portion.

24. The multilayered printed wiring board according to claim 13, wherein the lid-shaped conductive structure has a shape of two partial circles adjoined to each other.

25. The multilayered printed wiring board according to claim 13, wherein the lid-shaped conductive structure has a protruding portion only where the first filled via structure is formed, and the protruding portion is the second conductive portion.

* * * * *